US011156700B2

(12) United States Patent
Shimada et al.

(10) Patent No.: US 11,156,700 B2
(45) Date of Patent: Oct. 26, 2021

(54) DISTANCE SENSOR

(71) Applicant: HAMAMATSU PHOTONICS K.K., Hamamatsu (JP)

(72) Inventors: Akihiro Shimada, Hamamatsu (JP); Mitsuhito Mase, Hamamatsu (JP); Jun Hiramitsu, Hamamatsu (JP); Takashi Suzuki, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 517 days.

(21) Appl. No.: 16/097,664

(22) PCT Filed: Apr. 19, 2017

(86) PCT No.: PCT/JP2017/015745
§ 371 (c)(1),
(2) Date: Oct. 30, 2018

(87) PCT Pub. No.: WO2017/191757
PCT Pub. Date: Nov. 9, 2017

(65) Prior Publication Data
US 2020/0333459 A1 Oct. 22, 2020

(30) Foreign Application Priority Data
May 2, 2016 (JP) .............................. JP2016-092659

(51) Int. Cl.
*H01L 27/14* (2006.01)
*G01S 7/486* (2020.01)
(Continued)

(52) U.S. Cl.
CPC ............ *G01S 7/486* (2013.01); *G01S 7/4814* (2013.01); *G01S 7/4816* (2013.01); *G01S 17/10* (2013.01);
(Continued)

(58) Field of Classification Search
None
See application file for complete search history.

(56) References Cited

U.S. PATENT DOCUMENTS 6,180,969 B1* 1/2001 Yang .................... H01L 27/1443
257/291
2001/0011736 A1* 8/2001 Dierickx ........... H01L 27/14609
257/218
(Continued)

FOREIGN PATENT DOCUMENTS

DE 102005056774 A1 5/2007
JP H6-164401 A 6/1994
(Continued)

OTHER PUBLICATIONS

International Preliminary Report on Patentability dated Nov. 15, 2018 for PCT/JP2017/015745.

*Primary Examiner* — Hovhannes Baghdasaryan
(74) *Attorney, Agent, or Firm* — Faegre Drinker Biddle & Reath LLP

(57) ABSTRACT

The present embodiment relates to a distance sensor that reduces a difference in amounts of current injected into each of plural charge collection regions prepared for one photosensitive region in order to avoid saturation caused by disturbance light. A current injection circuit injecting current into each charge collection region includes a voltage generation circuit generating a control voltage for adjustment of the injected current amount, and the voltage generation circuit generates the control voltage corresponding to a large amount of charge between the charge amounts of storage nodes coupled, respectively, to the charge collection regions. Meanwhile, a cascode device is disposed between a transistor configured to adjust the amount of current according to
(Continued)

the control voltage and the storage node, and a potential of a current output end of the transistor and a potential of the storage node are separated.

2 Claims, 20 Drawing Sheets

(51) Int. Cl.
    *H04N 5/369*     (2011.01)
    *G01S 7/481*     (2006.01)
    *G01S 17/10*     (2020.01)
    *H01L 27/144*     (2006.01)
    *G01S 17/89*     (2020.01)

(52) U.S. Cl.
    CPC .......... *G01S 17/89* (2013.01); *H01L 27/1443* (2013.01); *H04N 5/369* (2013.01)

(56) References Cited

U.S. PATENT DOCUMENTS

| | | | | |
|---|---|---|---|---|
| 2003/0011829 A1* | 1/2003 | Dierickx | ............. | H04N 5/3742 358/513 |
| 2003/0213915 A1* | 11/2003 | Chao | ................ | H01L 27/14643 250/370.14 |
| 2004/0036010 A1* | 2/2004 | Hsieh | .................. | H01L 27/1463 250/208.1 |
| 2004/0041930 A1* | 3/2004 | Chao | ................ | H01L 27/14632 348/294 |
| 2004/0262651 A1* | 12/2004 | Mouli | ............... | H01L 27/14643 257/290 |
| 2006/0249765 A1* | 11/2006 | Hsieh | ................ | H01L 27/14632 257/292 |
| 2009/0230437 A1* | 9/2009 | Kawahito | ............... | G01S 17/10 257/226 |

FOREIGN PATENT DOCUMENTS

| | | |
|---|---|---|
| JP | 2008-089346 A | 4/2008 |
| JP | 2009-047660 A | 3/2009 |
| JP | 2009-276243 A | 11/2009 |
| JP | 2011-112376 A | 6/2011 |
| JP | 2012-185174 A | 9/2012 |
| JP | 2015-215182 A | 12/2015 |
| KR | 1020120104969 A | 9/2012 |
| KR | 1020130045833 A | 5/2013 |
| KR | 1020140111639 A | 9/2014 |
| KR | 1020150040398 A | 4/2015 |
| KR | 1020170015941 A | 2/2017 |
| KR | 1020180054895 A | 5/2018 |
| WO | WO-2015/170542 A1 | 11/2015 |

\* cited by examiner

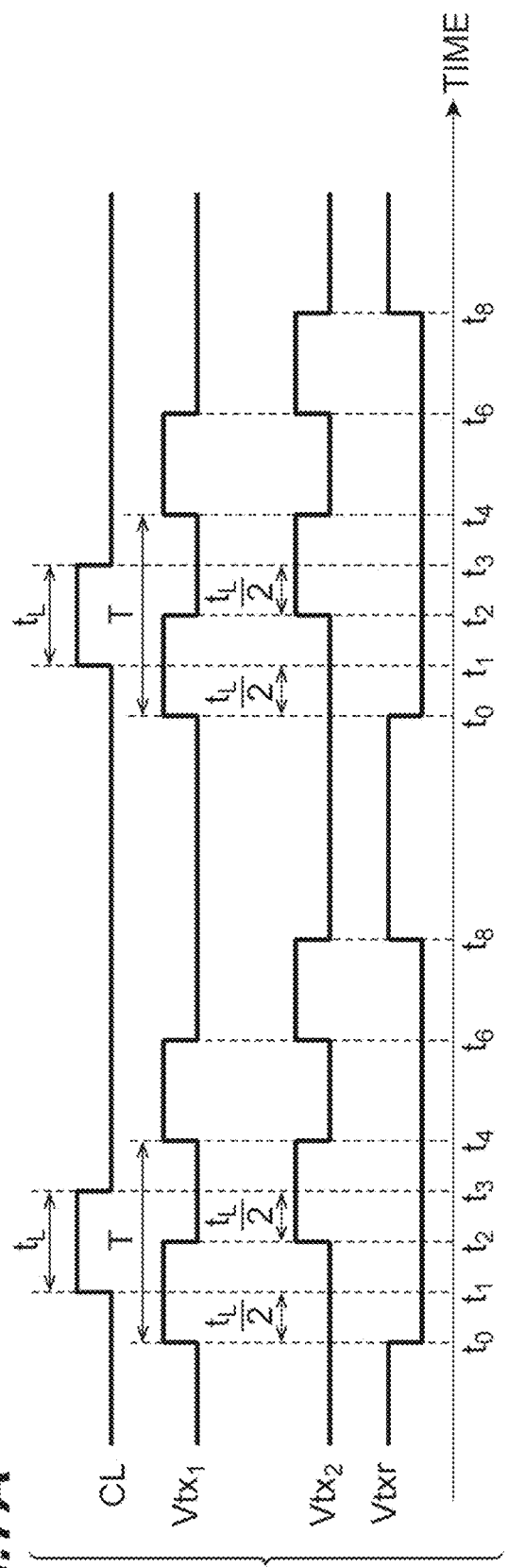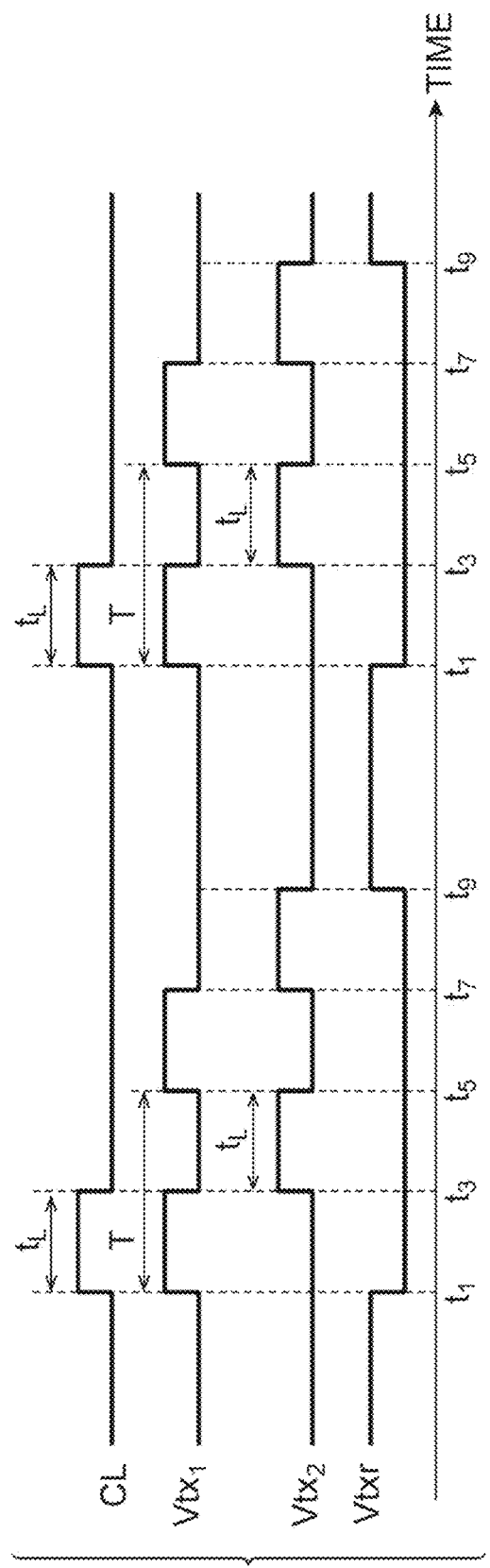

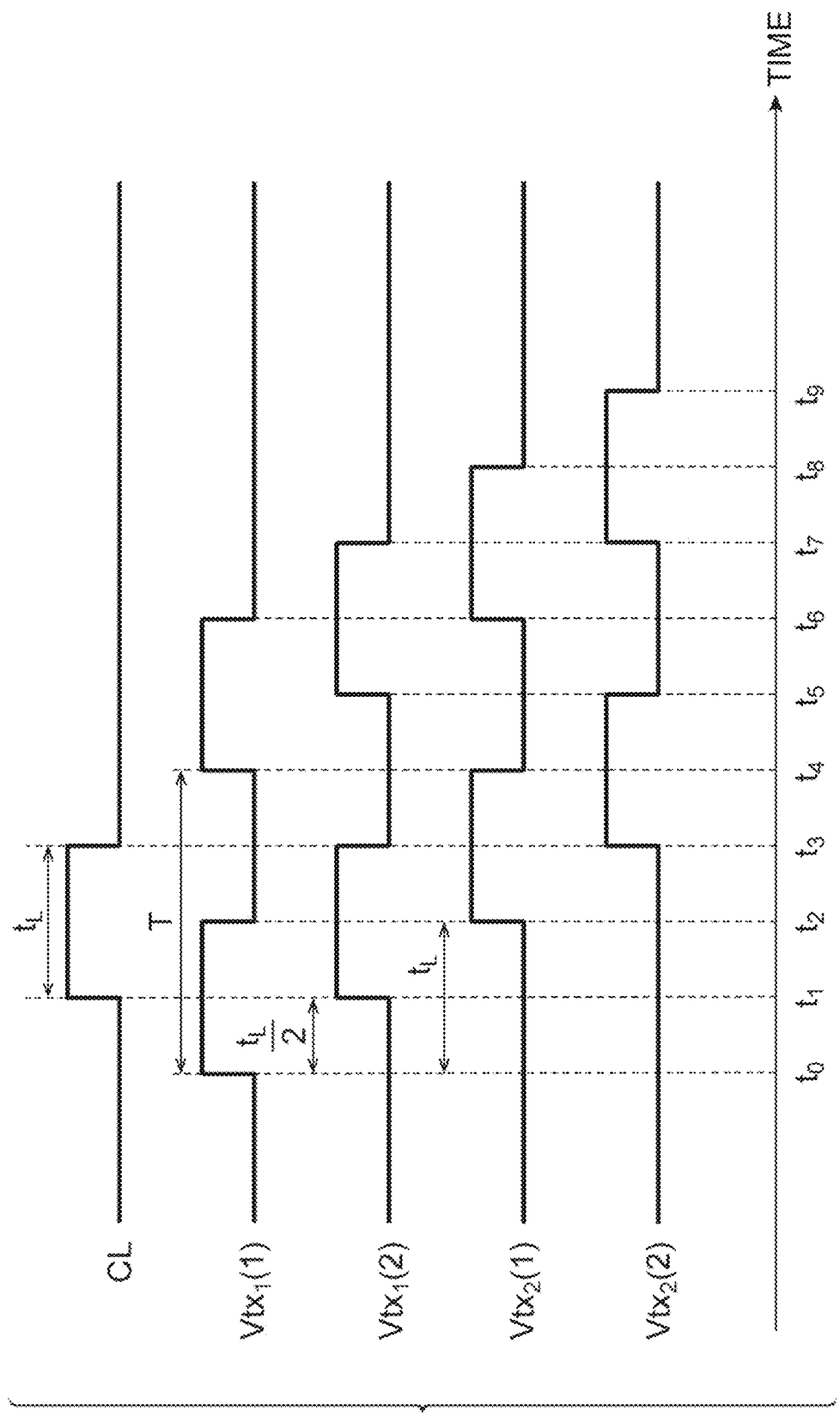

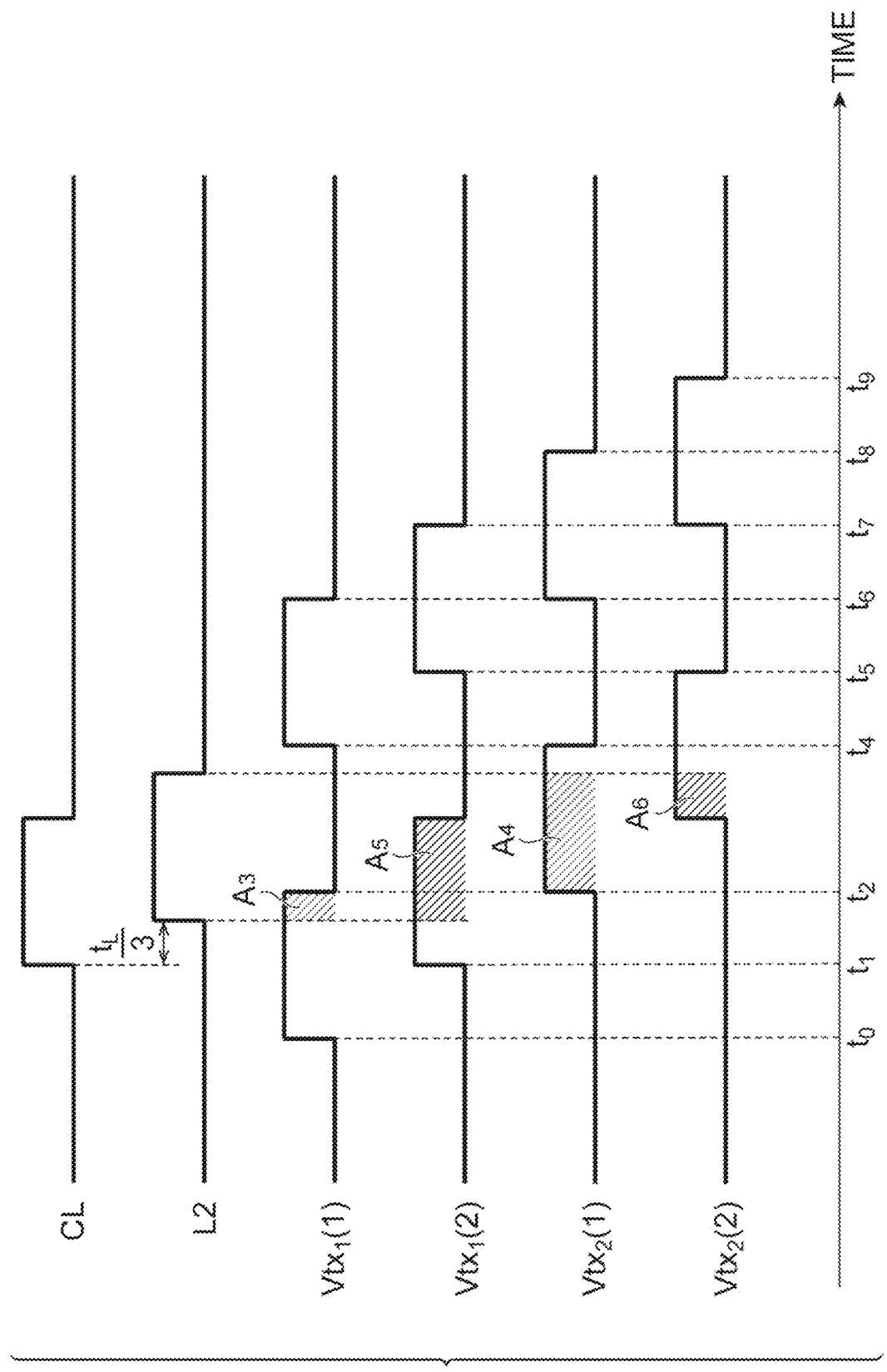

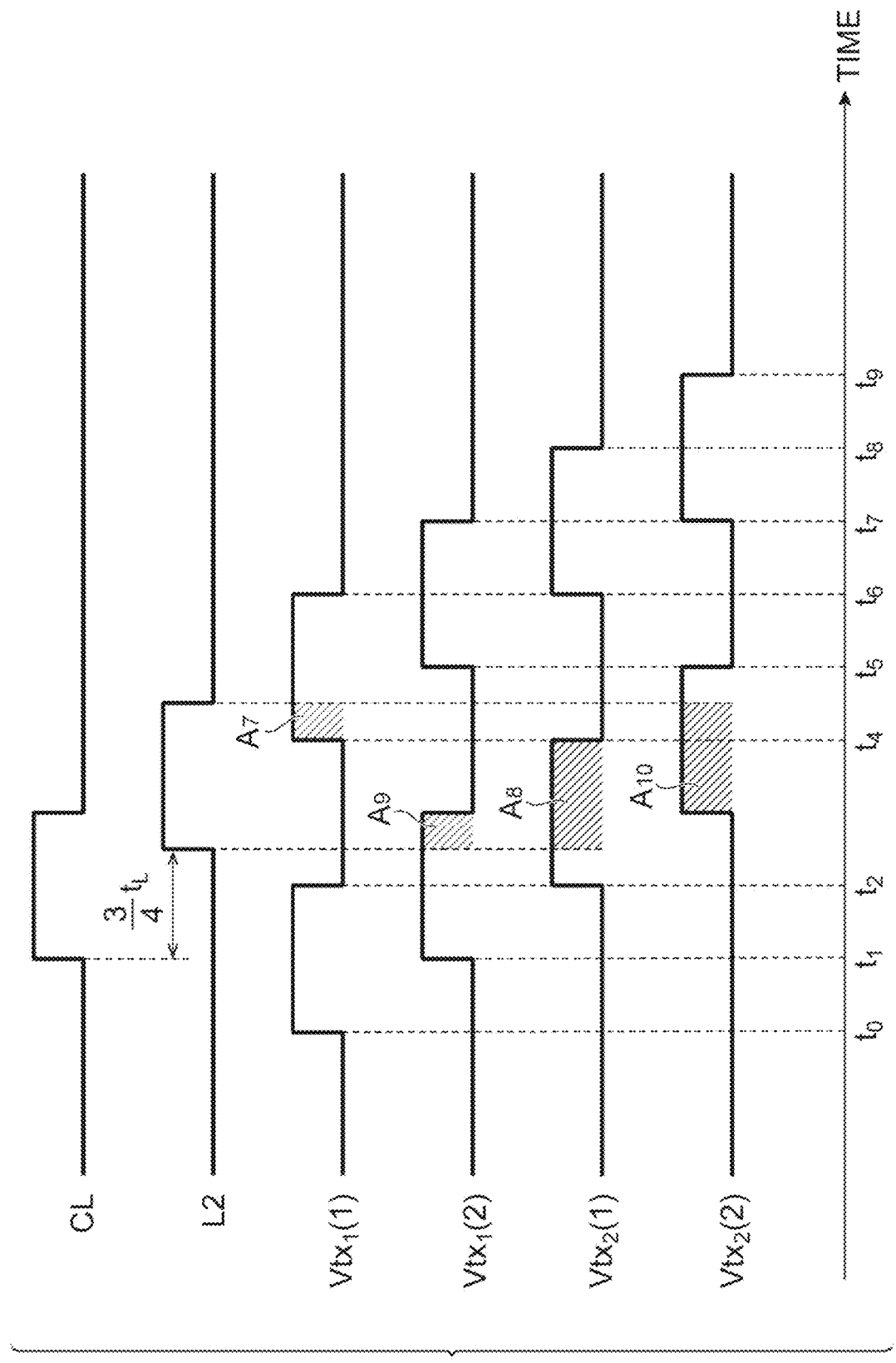

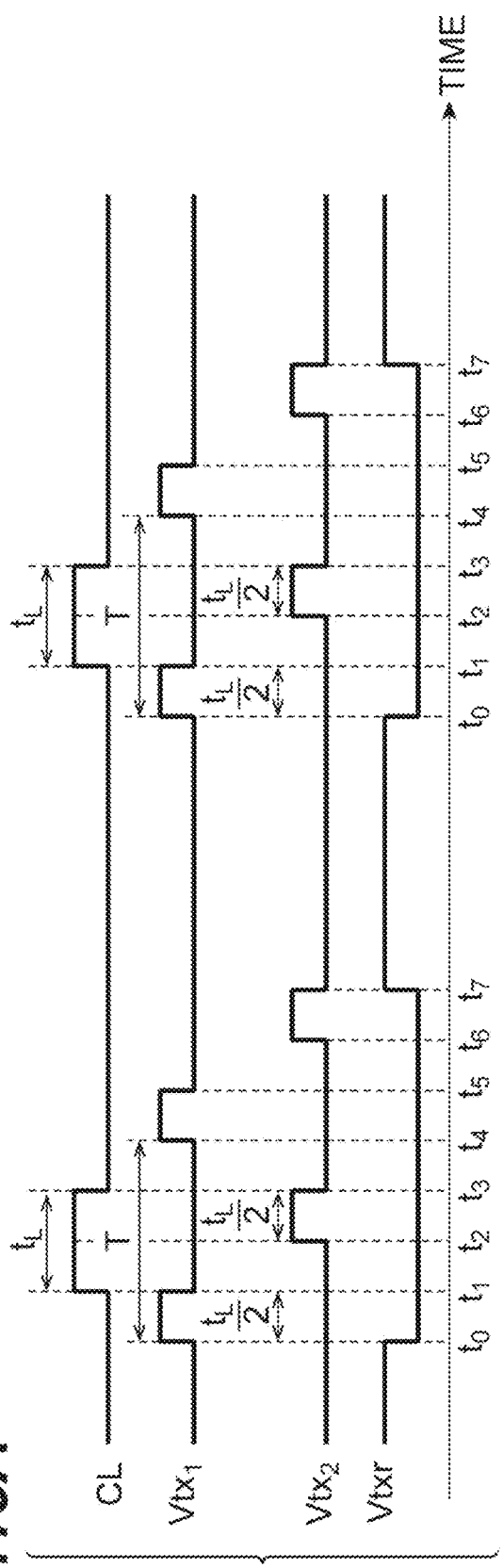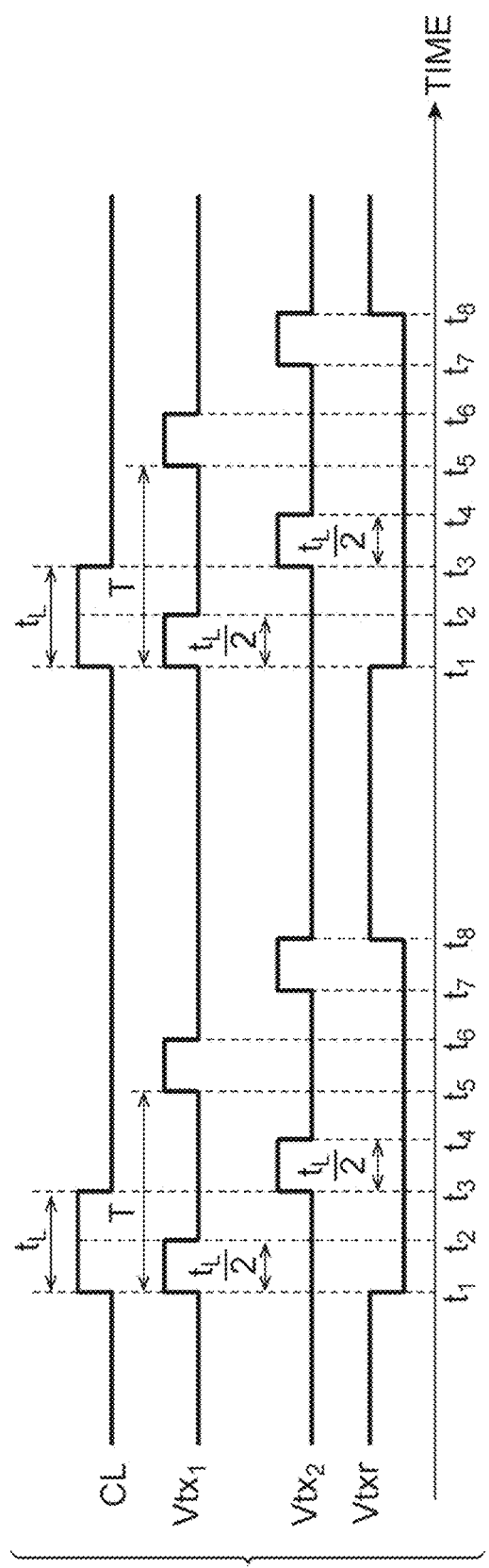

DISTANCE SENSOR

TECHNICAL FIELD

The present invention relates to a distance sensor.

BACKGROUND ART

A time-of-flight (TOF) method for measuring a distance to an object based on a time difference between a timing of emitting pulsed light from a light source and a timing when reflected light from the object reaches has been known. For example, the following Patent Document 1 describes a distance sensor based on a TOF method. The distance sensor disclosed in Patent Document 1 has a charge distribution type configuration in which charges generated within a photosensitive region during a first period after irradiation of light and charges generated within the photosensitive region during a second period after the first period are stored in storage nodes coupled to different charge collection regions, respectively. Then, the distance to the object is calculated based on a ratio of charge amounts stored in these storage nodes. Furthermore, the distance sensor disclosed in Patent Document 1 includes a means for injecting current to each of the storage nodes in order to prevent saturation caused by a disturbance light component.

CITATION LIST

Patent Literature

Patent Document 1: German Patent Application Publication No. 102005056774

SUMMARY OF INVENTION

Technical Problem

As a result of examining the above related art, the inventors have found out the following problems. That is, some distance sensors having the charge distribution type configuration injects the current to the storage nodes coupled to the charge collection regions, respectively, in order to prevent the saturation caused by the disturbance light component (see Patent Document 1). In such a system, it is desired to accurately control the current amount injected into the storage node to a uniform magnitude. This is because an error occurs in a result of calculation of a distance to an object if the current amounts injected into the storage nodes coupled, respectively, to the different charge collection regions vary.

The present invention has been made to solve the above-described problem, and an object thereof is to provide a distance sensor capable of reducing a difference in the amounts of current injected to storage nodes coupled, respectively, to different charge collection regions prepared for one photosensitive region.

Solution to Problem

A distance sensor according to the present embodiment is configured to irradiate an object with light and measure a distance to the object by detecting reflected light from the object, and comprises a semiconductor substrate, first and second transfer electrodes, a voltage generation circuit, first and second transistors, a third transistor, and a fourth transistor in order to solve the above problem. The semiconductor substrate has a photosensitive region which generates charges corresponding to a light amount of the reflected light, and first and second charge collection regions each collecting the charges from the photosensitive region. Incidentally, the first and second charge collection regions are disposed individually in the state of being separated from the photosensitive region by a predetermined distance. The first transfer electrode is an electrode configured to control charge transfer from the photosensitive region to the first charge collection region and is disposed on a region between the photosensitive region and the first charge collection region. In addition, the first transfer electrode is set to an on-potential that enables the charge transfer during a first period after irradiation of light, and set to an off-potential that stops the charge transfer during a second period following the first period. The second transfer electrode is an electrode configured to control charge transfer from the photosensitive region to the second charge collection region and is disposed on a region between the photosensitive region and the second charge collection region. In addition, the second transfer electrode is set to the off-potential during the first period and set to the on-potential during the second period. The voltage generation circuit has one end electrically connected to a first constant potential line set to a predetermined potential and the other end electrically connected to a second constant potential line set to a lower potential than the first constant potential line. The voltage generation circuit generates a control voltage corresponding to a larger one between a charge amount stored in a storage node electrically coupled to the first charge collection region and a charge amount stored in a storage node electrically coupled to the second charge collection region. Each of the first and second transistors has a control terminal to which the control voltage is applied, a first current terminal connected to the first constant potential line, and a second current terminal. The third transistor has a first current terminal connected to the second current terminal of the first transistor, a second current terminal connected to the storage node electrically coupled to the first charge collection region, and a control terminal to which a constant voltage is applied. The fourth transistor has a first current terminal connected to the second current terminal of the second transistor, a second current terminal connected to the storage node electrically coupled to the second charge collection region, and a control terminal to which a constant voltage is applied.

Advantageous Effects of Invention

According to the distance sensor according to the present embodiment, a cascode device is disposed between a transistor and the storage node, the transistor adjusting the amount of current according to the control voltage generated based on the charge amounts of the storage nodes coupled, respectively, to the plurality of charge collection regions prepared for one photosensitive region, and a potential of a current output end of the transistor and a potential of the storage node are separated. As a result, it is possible to reduce a difference in the amounts of injected current between the storage nodes coupled, respectively, to the charge collection regions.

BRIEF DESCRIPTION OF DRAWINGS

FIG. 7A is a timing chart illustrating operations of transfer electrodes in a storage frame of a first frame, and FIG. 7B is a timing chart illustrating operations of the transfer electrodes in a storage frame of a second frame.

FIG. 8 is a view illustrating timing charts of the first frame and the second frame for one-time driving clock in an overlapping manner.

FIG. 9 is a view further illustrating a chart of reception light pulse waveforms of reflected light in the timing chart illustrated in FIG. 8.

FIG. 10 is a view further illustrating a chart of reception light pulse waveforms of reflected light in the timing chart illustrated in FIG. 8.

FIGS. 15A and 15B are views illustrating a timing chart of a driving method according to a first modification.

DESCRIPTION OF EMBODIMENTS

Figure 1:
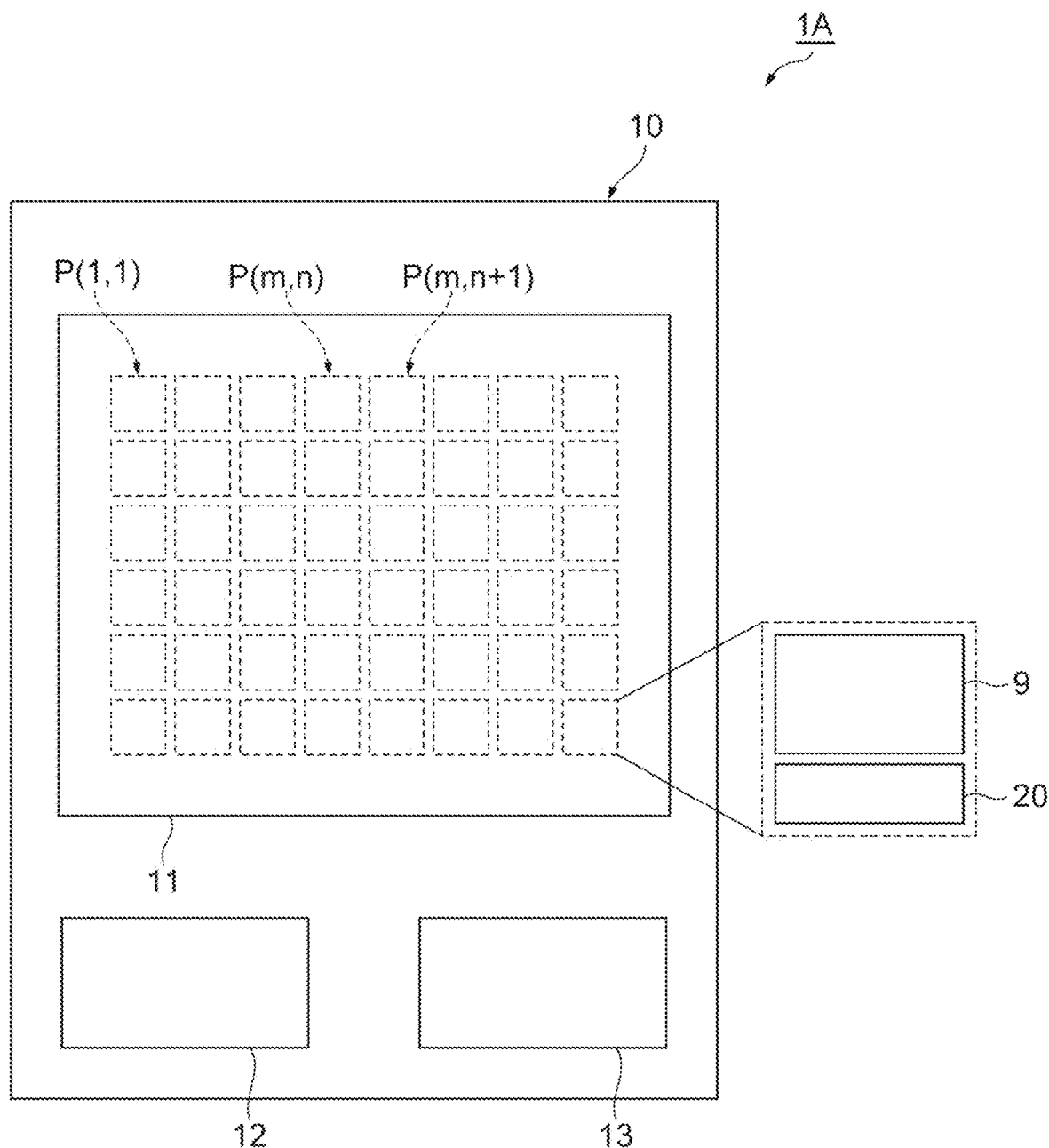
FIG. 1 is a plan view illustrating a configuration of a distance sensor according to an embodiment of the present invention.

[Description of Embodiments of Invention of Present Application]

First, ones corresponding to embodiments of the invention of the present application will be individually listed and described.

(1) A distance sensor according to the present embodiment is configured to irradiate an object with light and measure a distance to the object by detecting reflected light from the object, and as an aspect thereof, comprises a semiconductor substrate, first and second transfer electrodes, a voltage generation circuit, first and second transistors, a third transistor, and a fourth transistor. The semiconductor substrate has a photosensitive region which generates charges corresponding to a light amount of the reflected light, and first and second charge collection regions each of collecting the charges from the photosensitive region. Incidentally, the first and second charge collection regions are disposed individually in the state of being separated from the photosensitive region by a predetermined distance. The first transfer electrode is an electrode configured to control charge transfer from the photosensitive region to the first charge collection region and is disposed on a region between the photosensitive region and the first charge collection region. In addition, the first transfer electrode is set to an on-potential that enables the charge transfer during a first period after irradiation of light, and set to an off-potential that stops the charge transfer during a second period following the first period. The second transfer electrode is an electrode configured to control charge transfer from the photosensitive region to the second charge collection region and is disposed on a region between the photosensitive region and the second charge collection region. In addition, the second transfer electrode is set to the off-potential during the first period and set to the on-potential during the second period. The voltage generation circuit has one end connected to a first constant potential line set to a predetermined potential and the other end connected to a second constant potential line set to a lower potential than the first constant potential line. The voltage generation circuit generates a control voltage corresponding to a larger one between a charge amount stored in a storage node coupled to the first charge collection region and a charge amount stored in a storage node coupled to the second charge collection region. Each of the first and second transistors has a control terminal to which the control voltage is applied, a first current terminal connected to the first constant potential line, and a second current terminal. The third transistor has a first current terminal connected to the second current terminal of the first transistor, a second current terminal connected to the storage node coupled to the first charge collection region, and a control terminal to which a constant voltage is applied. The fourth transistor has a first current terminal connected to the second current terminal of the second transistor, a second current terminal connected to the storage node coupled to the second charge collection region, and a control terminal to which a constant voltage is applied.

(2) Potentials of the storage nodes, coupled to the different charge collection regions, respectively, vary depending on the stored charge amounts. Thus, a difference also occurs between the potentials of the respective storage nodes depending on the difference between the stored charge amounts. Therefore, when each of the first and second transistors is directly connected to the corresponding storage node, a difference occurs between voltages between current terminals of the first and second transistors. Therefore, the amount of charge injected into the first charge collection region and the amount of charge injected into the second charge collection region are not equal to each other due to channel length modulation effects of the first and second transistors so that a slight difference occurs therebetween. As a result, an error occurs in the measured distance.

(3) With respect to such a problem, the third transistor is connected between the first transistor and the storage node coupled to the first charge collection region, and the fourth transistor is connected between the second transistor and the storage node coupled to the second charge collection region, in the distance sensor according to the present embodiment. In such a configuration, a potential of a current output end of the first transistor and a potential of the corresponding storage node are separated. Similarly, a potential of the current output end of the second transistor and a potential of the corresponding storage node are also separated. As a result, even if there is a potential difference between the storage nodes, the influence on voltages between current terminals of the first and second transistors can be suppressed. That is, it is possible to reduce a difference in the amounts of current injected from the first and second transistors to the respective storage nodes, respectively.

(4) As one aspect of the present embodiment, the third and fourth transistors may be MOSFETs in the distance sensor having the above structure. Accordingly, the potential of the current output end of the first transistor and the potential of the corresponding storage node are suitably separated, and the potential of the current output end of the second transistor and the potential of the corresponding storage node are also separated.

As described above, each aspect listed in [Description of Embodiment of Invention of Present Application] can be applied to each of the remaining aspects or to all the combinations of these remaining aspects.

[Details of Embodiment of Invention of Present Application]

Hereinafter, a specific structure of the distance sensor according to the present embodiments will be described in detail with reference to the attached drawings. Incidentally, the invention is not limited to these various examples, but is illustrated by the claims, and any modification within the equivalent meaning and the equivalent scope of the claims is intended to be included therein. In the description of the drawings, the same elements will be denoted by the same reference signs, and redundant descriptions thereof will be omitted. In the following description, when a transistor is an FET, a control terminal means a gate, and a current terminal means a source or a drain. When the transistor is a bipolar transistor, a control terminal means a base, and a current terminal means a collector or an emitter.

FIG. 1 is a plan view illustrating a configuration of a distance sensor 1A according to an embodiment of the present invention. The distance sensor 1A in FIG. 1 is a device that measures a distance to an object by irradiating the object with light and detecting reflected light from the object. As illustrated in FIG. 1, the distance sensor 1A includes an imaging region 11 formed on a semiconductor substrate 10, a sensor drive circuit 12, and a processing circuit 13. The sensor drive circuit 12 drives the imaging region 11. The processing circuit 13 processes an output of the imaging region 11. The imaging region 11 has a plurality of pixels P disposed one-dimensionally or two-dimensionally on the semiconductor substrate 10. In FIG. 1, pixels P (m, n) in m rows and n columns are illustrated (m and n are natural numbers). Each of the pixels P (m, n) includes a light receiving unit 9 and a current injection circuit 20. The imaging region 11 detects the reflected light from the object for each of the pixels P. Then, the distance for each of the pixels P of the image of the object is obtained by obtaining the time from the irradiation of the light to the arrival of the reflected light for each of the pixels P. The distance sensor 1A is a charge distribution type distance sensor, and obtains the time from the irradiation of light to the arrival of the reflected light in accordance with a ratio of charge amounts distributed to two positions within each of the pixels P.

Figure 2:
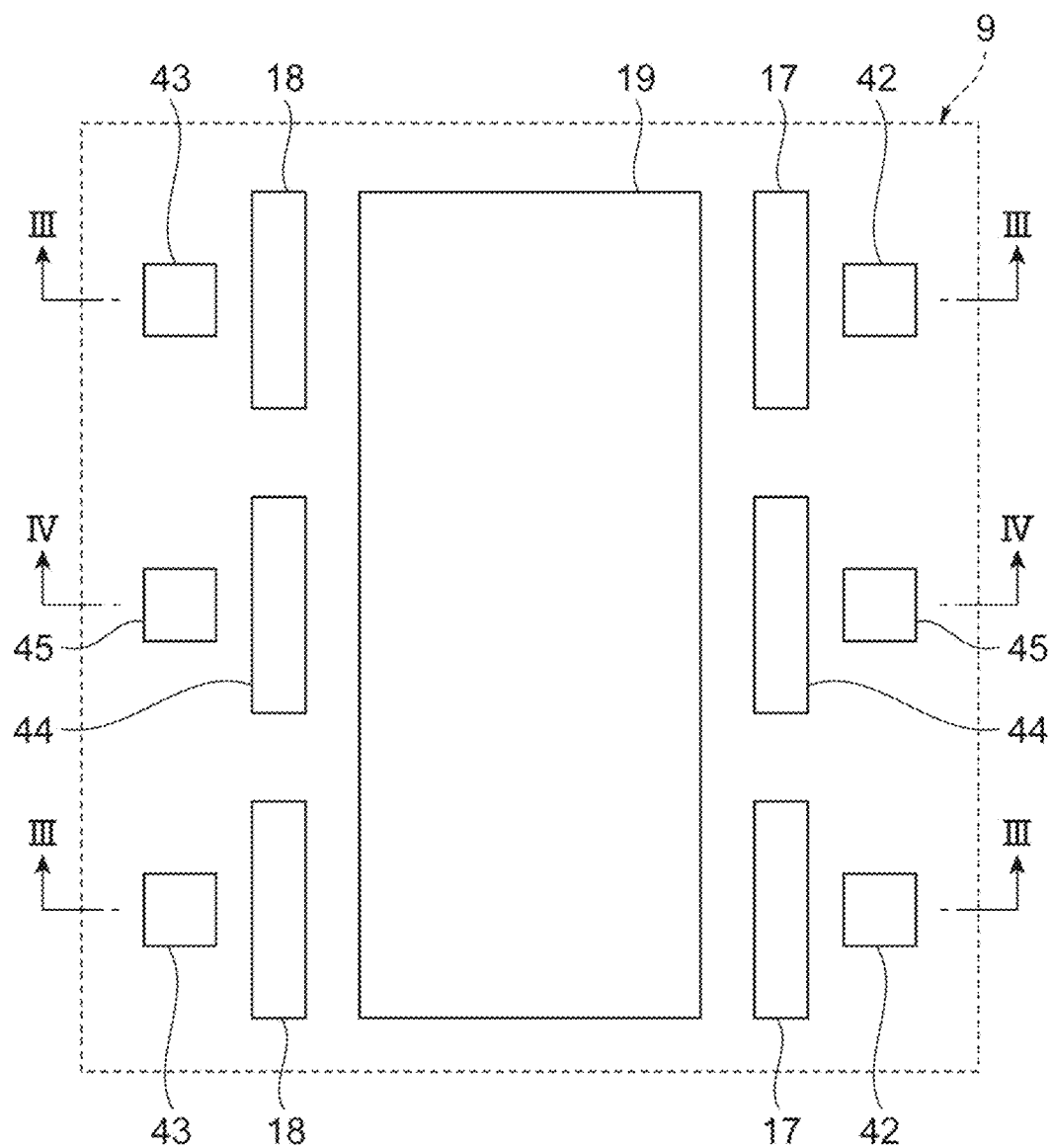
FIG. 2 is a plan view of a light receiving unit of each pixel of the distance sensor illustrated in FIG. 1.
Figure 3:
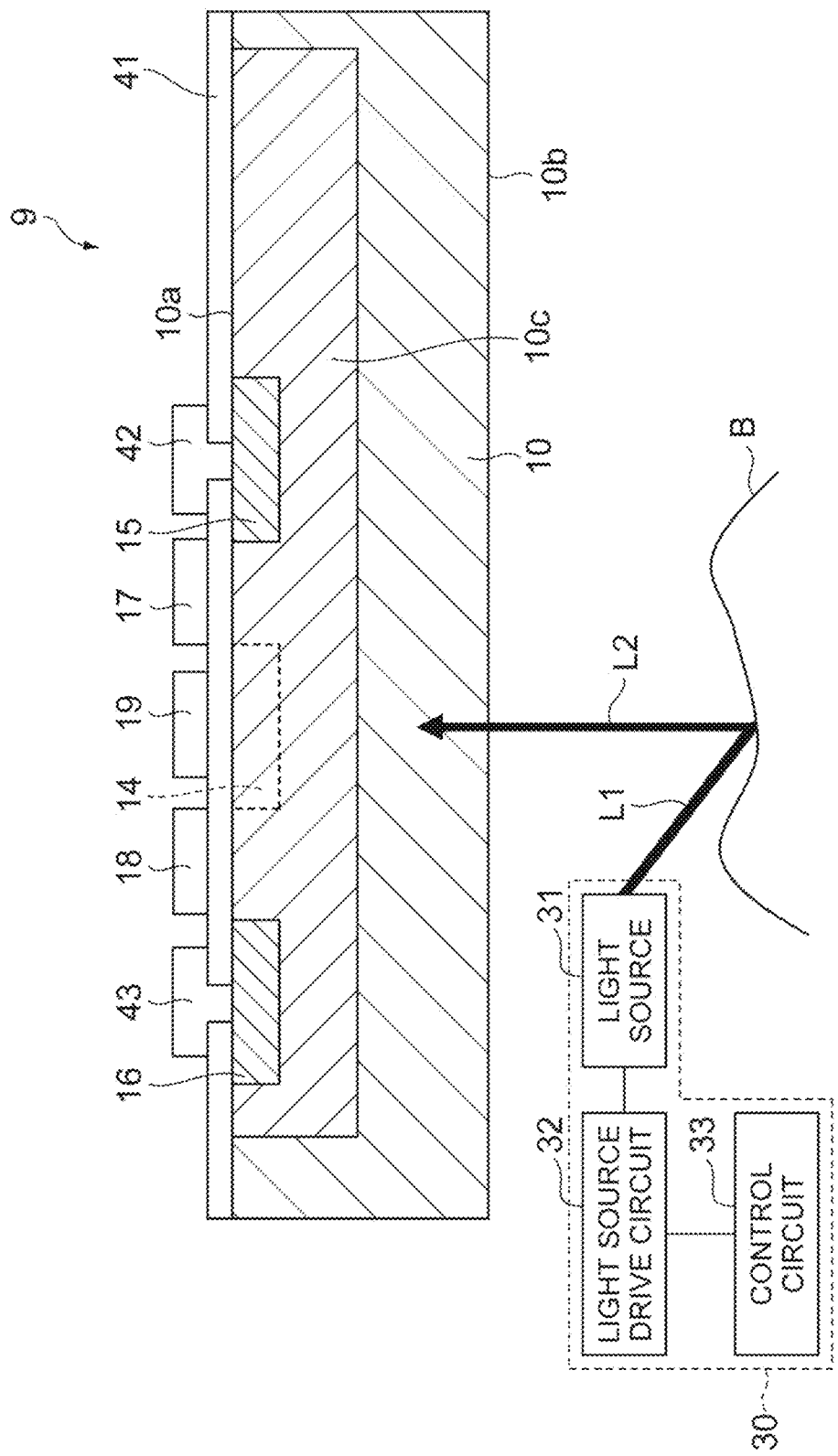
FIG. 3 is a cross-sectional view taken along a line III-III of FIG. 2.
Figure 4:
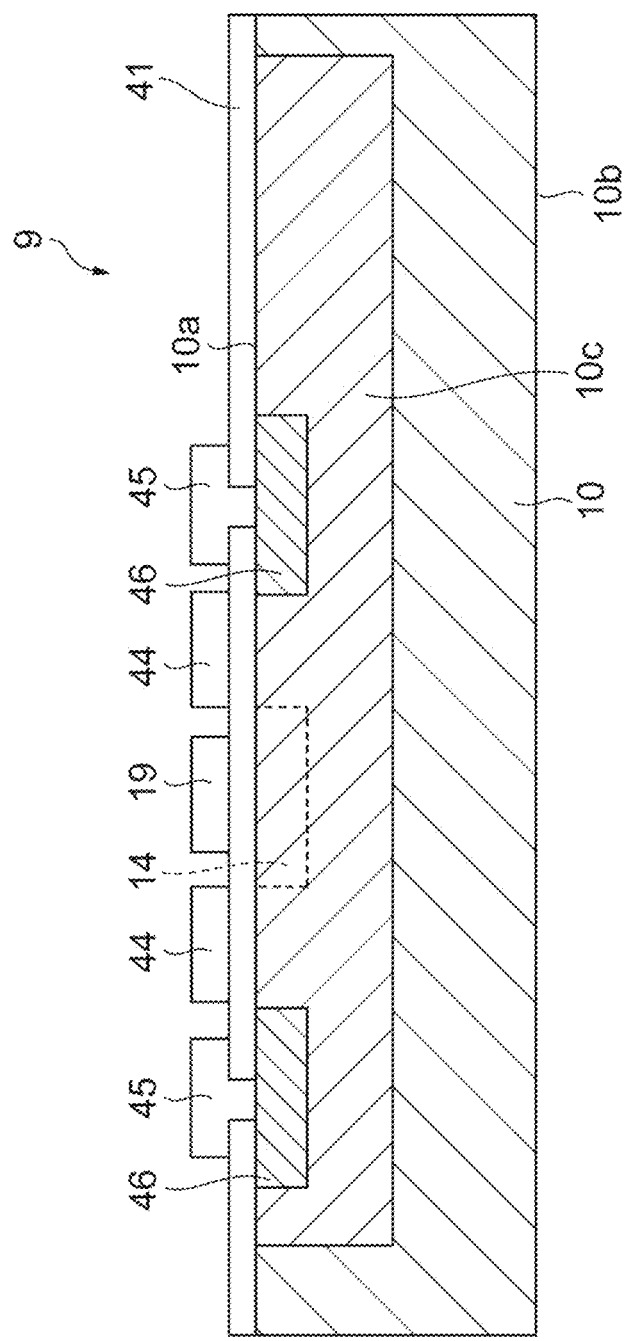
FIG. 4 is a cross-sectional view taken along a line IV-IV of FIG. 2.

FIG. 2 is a plan view of the light receiving unit 9 of each of the pixels P (m, n) of the distance sensor 1A illustrated in FIG. 1. FIGS. 3 and 4 are cross-sectional views taken along a line and a line IV-IV of FIG. 2, respectively, and views illustrating cross sectional configurations of the light receiving unit 9. In addition, FIG. 3 also illustrates a light source unit 30. The light source unit 30 is a component configured to irradiate an object with light L1, and includes a light source 31, a light source drive circuit 32, and a control circuit 33. The light source 31 includes a semiconductor light emitting element such as a laser element or a light emitting diode. The light source drive circuit 32 drives the light source 31 at a high frequency. The control circuit 33 outputs a driving clock of the light source drive circuit 32. In addition, pulsed light, which has been subjected to intensity modulation of a square wave or a sinusoidal wave, is periodically emitted from the light source 31.

The irradiation light L1 from the light source 31 is reflected by a surface of the object B and is incident on each of the pixels P (m, n) in the imaging region 11 of the distance sensor 1A from a back surface 10b side of the semiconductor substrate 10 as reflected light L2. Incidentally, a plurality of imaging lenses corresponding to the pixels P (m, n), respectively, may be disposed to oppose the back surface 10b of the semiconductor substrate 10.

As illustrated in FIG. 2, the light receiving unit 9 includes a transfer electrode 17 (first transfer electrode), a transfer electrode 18 (second transfer electrode), a transfer electrode 44, a photogate electrode 19, signal extraction electrodes 42 and 43, and a charge discharging electrode 45. In FIG. 2, the number of each of the transfer electrodes 17 and 18 and the signal extraction electrodes 42 and 43 is two, but may be one. In FIG. 2, the number of each of the transfer electrode 44 and the charge discharging electrode 45 is two, but may be one.

As illustrated in FIG. 3, the light receiving unit 9 further has a photosensitive region 14, a charge collection region 15 (first charge collection region), and a charge collection region 16 (second charge collection region). The photosensitive region 14 receives the reflected light L2 and generates charges corresponding to the light amount. The charge collection regions 15 and 16 are disposed so as to be adjacent to the photosensitive region 14 in a state of sandwiching the photosensitive region 14. Each of the charge collection regions 15 and 16 collects charges from the photosensitive region 14 so that the charges are stored in each storage node coupled thereto. Incidentally, the photosensitive region 14 is disposed between the charge collection regions 15 and 16 in FIG. 3, but the charge collection regions 15 and 16 may be adjacent to one side of the photosensitive region 14, and there is no restriction on a positional relationship therebetween.

Specifically, the semiconductor substrate 10 is made of a high-concentration p-type (second conductivity type) semiconductor, and the light receiving unit 9 of each of the pixels P (m, n) has a low-concentration p-type (second conductivity type) surface region 10c provided on a surface 10a side of the semiconductor substrate 10. In addition, an insulating layer 41 is formed on the surface 10a of the semiconductor substrate 10, and the photogate electrode 19 is formed on the surface region 10c between the charge collection regions 15 and 16 with the insulating layer 41 interposed therebetween. A region inside the surface region 10c positioned immediately below the photogate electrode 19 is the photosensitive region 14. A potential of the photosensitive region 14 is controlled by a voltage applied to the photogate electrode 19. A slight positive DC voltage is applied to the photogate electrode 19 as necessary. As a result, hole-electron pairs are generated in response to incidence of the reflected light L2 to the photosensitive region 14.

The charge collection regions 15 and 16 are high-concentration n-type (first conductivity type) regions formed on the surface region 10c side of the semiconductor substrate 10. The charge collection regions 15 and 16 are also referred to as floating diffusion regions or charge storage regions. An n-type semiconductor has electrons as carriers in an electrically-neutral state, and is ionized positively in the case of missing the carriers. That is, each band structure of the high-concentration n-type charge collection regions 15 and 16 has a shape greatly recessed downward and forms a potential well. The signal extraction electrode 42 is formed on the charge collection region 15, and the signal extraction electrode 43 is formed on the charge collection region 16. The signal extraction electrodes 42 and 43 are in contact with the charge collection regions 15 and 16, respectively, through openings formed in the insulating layer 41.

The transfer electrode 17 is disposed on a region between the photosensitive region 14 and the charge collection region 15. The transfer electrode 18 is disposed on a region between the photosensitive region 14 and the charge collection region 16. When a positive potential (on-potential) is applied to the transfer electrode 17, a potential of the region immediately below the transfer electrode 17 has an intermediate magnitude between a potential of the photosensitive region 14 and a potential of the charge collection region 15. In this manner, potential steps from the photosensitive region 14 to the charge collection region 15 are formed, and electrons fall into the potential well of the charge collection region 15 (the charges are stored in the well). Similarly, when a positive potential (on-potential) is applied to the transfer electrode 18, a potential of the region immediately below the transfer electrode 18 has an intermediate magnitude between the potential of the photosensitive region 14 and a potential of the charge collection region 16. As a result, potential steps from the photosensitive region 14 to the charge collection region 16 are formed, and electrons fall into the potential well of the charge collection region 16.

Incidentally, the structure of providing the signal extraction electrodes 42 and 43 on the charge collection regions 15 and 16 to extract signals is adopted in the present embodiment, but it is also possible to separately provide a high-concentration region for signal extraction to be adjacent to the charge collection regions 15 and 16, and dispose other transfer electrodes on regions between the high-concentration region and each of the charge collection regions 15 and 16, and provide a signal extraction electrode on the high-concentration region to extract a signal.

As illustrated in FIG. 4, the light receiving unit 9 further has two charge collection regions 46. The charge collection regions 46 are formed in the surface region 10c of the semiconductor substrate 10, and are disposed so as to be adjacent to the photosensitive region 14 in the state of sandwiching the photosensitive region 14. Then, the charge discharging electrode 45 is formed on the charge collection region 46. The charge discharging electrode 45 is in contact with the charge collection region 46 through the opening formed in the insulating layer 41. The transfer electrode 44 is disposed on a region between the photosensitive region 14 and the charge collection region 46. When a positive potential (on-potential) is applied to the transfer electrode 44, charge move from the photosensitive region 14 to the charge collection region 46, and the charges are stored in a potential well of the charge collection region 46. Incidentally, a specific configuration of the charge collection region 46 is the same as those of the charge collection regions 15 and 16.

Figure 5A:
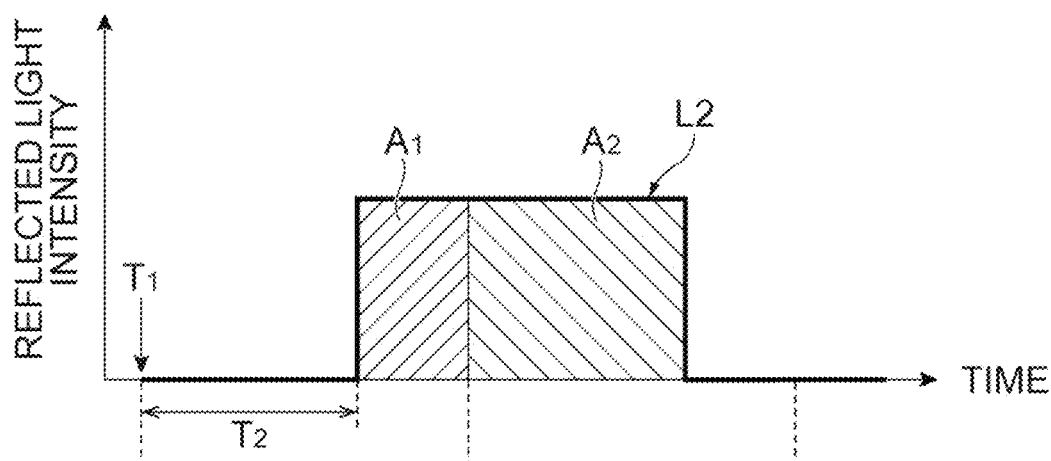
FIG. 5A is a graph illustrating an example of a temporal change of an intensity of reflected light incident on a certain pixel.
Figure 5B:
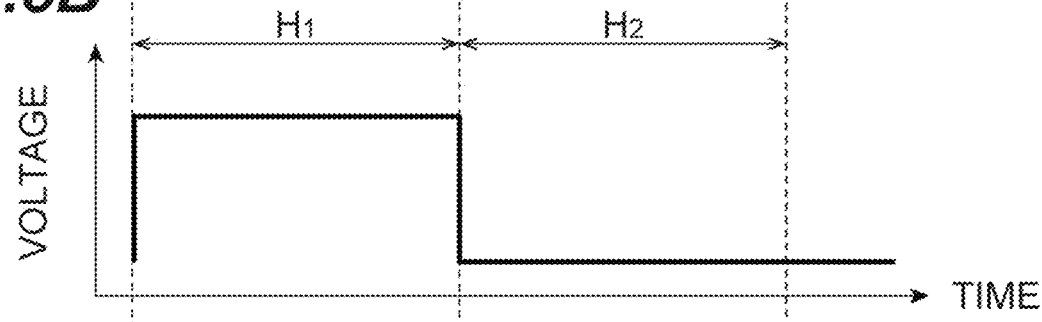
FIG. 5B is a graph illustrating a temporal change of a voltage applied to a transfer electrode.
Figure 5C:
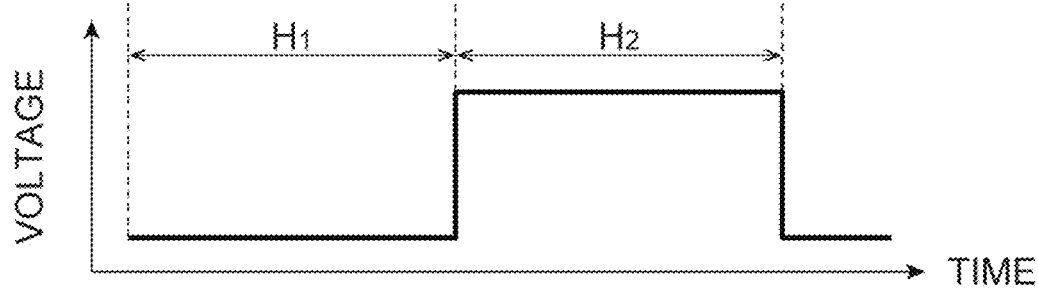
FIG. 5C is a graph illustrating a temporal change of a voltage applied to a transfer electrode.

FIG. 5A is a graph illustrating an example of a temporal change of the intensity of reflected light incident on a certain pixel P (m, n). FIG. 5B is a graph illustrating a temporal change of the voltage applied to the transfer electrode 17. FIG. 5C is a graph illustrating a temporal change of the voltage applied to the transfer electrode 18. As illustrated in FIG. 5A, the reflected light L2 is incident on the pixel P (m, n) delayed from a light irradiation timing $T_1$ by a time $T_2$ corresponding to a distance to the object B.

As illustrated in FIG. 5B, the transfer electrode 17 is set to the on-potential in a first period $H_1$ after light irradiation and set to the off-potential in a second period $H_2$ subsequent to the first period. In addition, the transfer electrode 18 is set to the off-potential in the first period $H_1$ and set to the on-potential in the second period $H_2$ as illustrated in FIG. 5C. Then, it is assumed that a part of the reflected light L2 (a region $A_1$ of the graph in the drawing) is incident on the pixel P (m, n) within the first period $H_1$. At this time, since the transfer electrode 18 is set to the off-potential while the transfer electrode 17 is set to the on-potential, the charges generated in the photosensitive region 14 move to the charge collection region 15 and are stored therein. The remaining part of the reflected light L2 (a region $A_2$ of the graph in the drawing) is incident on the pixel P (m, n) within the second period $H_2$. At this time, since the transfer electrode 17 is set to the off-potential while the transfer electrode 18 is set to the on-potential, the charges generated in the photosensitive region 14 move to the charge collection region 16 and are stored therein. Therefore, it is possible to know the delay time $T_2$, that is, the distance to the object B by obtaining a ratio between a charge amount stored in the charge collection region 15 (a charge amount stored in the storage node coupled to the charge collection region 15) and a charge amount stored in the charge collection region 16 (a charge amount stored in the storage node coupled to the charge collection region 16).

Here, the processing circuit 13 of the present embodiment may be a circuit that outputs a difference between these charge amounts by causing the charges stored in the charge collection region 15 and the charges stored in the charge collection region 16 to offset each other. Even in such a case, it is possible to know the ratio between the charge amount stored in the charge collection region 15 and the charge amount stored in the charge collection region 16 as long as it is possible to know the sum of the charge amounts stored in the charge collection regions 15 and 16 (the sum of the charge amounts stored in the storage nodes coupled, respectively, to the charge collection regions 15 and 16). Hereinafter, a driving system of the imaging region 11 to know the sum of the charge amounts stored in the charge collection regions 15 and 16 will be described.

Figure 6:
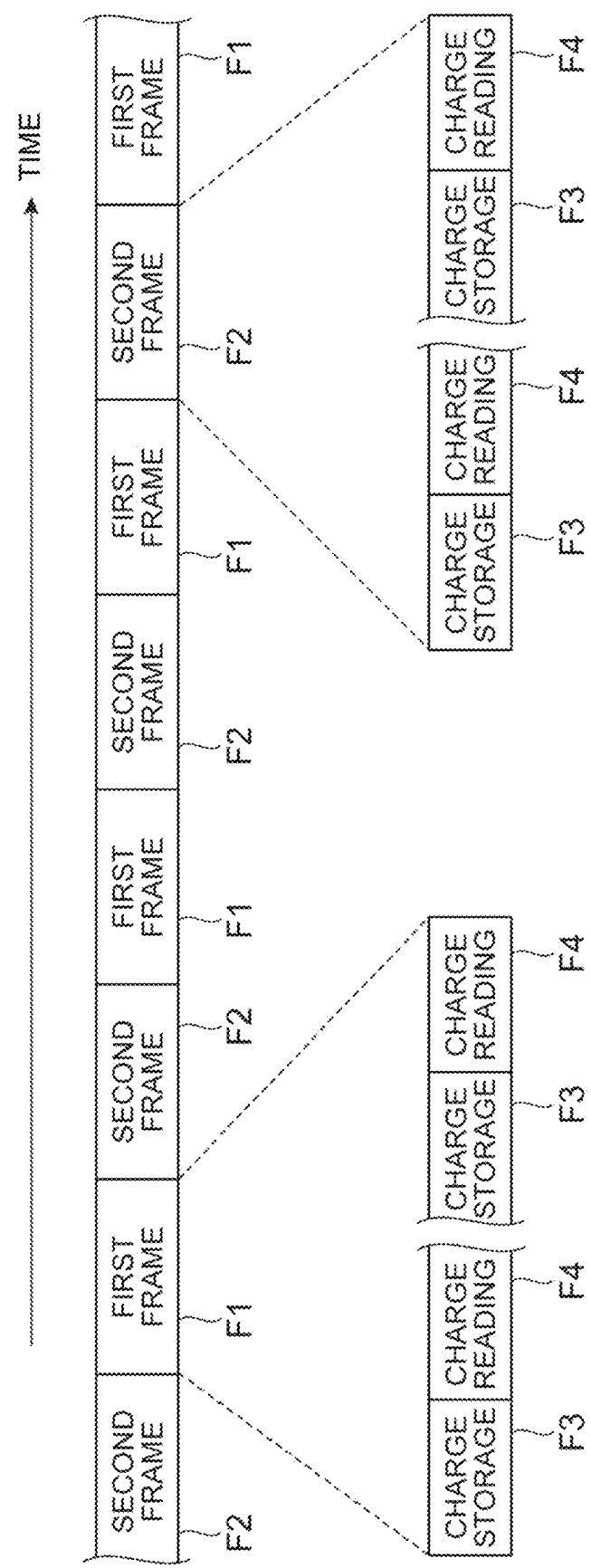
FIG. 6 is a view illustrating a driving system of an imaging region using a sensor drive circuit.

The sensor drive circuit 12 according to the present embodiment drives the transfer electrodes 17 and 18 by sequentially executing a plurality of time-divided frames (each of which represents a drive pattern of a transfer electrode). FIG. 6 is a view illustrating the driving system of the imaging region 11 using the sensor drive circuit 12. As illustrated in FIG. 6, in the driving system of the present embodiment, processing in each of first and second frames F1 and F2 is performed while alternately repeating the frames F1 and F2. FIG. 6 also illustrates processing contents within the respective frames F1 and F2. Within each of the frames F1 and F2, a storage frame F3 to perform charge storage in the charge collection regions 15 and 16 and a reading frame F4 to perform charge reading from the charge collection regions 15 and 16 are alternately repeated.

FIGS. 7A and 7B are timing charts illustrating operations of the transfer electrodes 17, 18, and 44 in the storage frame F3. FIG. 7A illustrates the timing chart in the first frame F1, and FIG. 7B illustrates the timing chart in the second frame F2. FIGS. 7A and 7B illustrate a driving clock CL of the light source drive circuit 32 output from the control circuit 33 (that is, a temporal change of an intensity of pulsed light output from the light source 31), a drive voltage $Vtx_1$ applied to the transfer electrode 17, a drive voltage $Vtx_2$ applied to the transfer electrode 18, and a drive voltage Vtxr applied to the transfer electrode 44.

In the storage frame F3, the drive voltages $Vtx_1$ and $Vtx_2$ are repeatedly switched between the on-potential and the off-potential twice at a certain cycle T each time the driving clock CL rises once. The cycle T is set to twice an on-time $t_L$ of the driving clock CL (for example, $T=2t_L$). In addition, an on-time (a period during which a drive voltage is set to the on-potential) of the drive voltages $Vtx_1$ and $Vtx_2$ in each cycle is equal to the on-time $t_L$ of the driving clock CL.

Specifically, equally-spaced times $t_0$, $t_1$, . . . , and $t_9$ are defined in the storage frame F3 of each of the first frame F1 and the second frame F2 as illustrated in FIGS. 7A and 7B. An interval among these times is half of one-time irradiation time $t_L$ of the irradiation light L1. At this time, the light source unit 30 emits the irradiation light L1 for the times $t_1$ to $t_3$. Then, the sensor drive circuit 12 sets the drive voltage $Vtx_1$ to the on-potential between the times $t_0$ and $t_2$ and between the times $t_4$ and $t_6$ and the drive voltage $Vtx_2$ to the on-potential between the times $t_2$ and $t_4$ and between the times $t_6$ and $t_8$ in the first frame F1 as illustrated in FIG. 7A. In addition, the sensor drive circuit 12 sets the drive voltage $Vtx_1$ to the on-potential between the times $t_1$ and $t_3$ and between the times $t_5$ and $t_7$ and the drive voltage $Vtx_2$ to the on-potential between the times $t_3$ and $t_5$ and between the times $t_7$ and $t_9$ in the second frame F2 as illustrated in FIG. 7B.

Incidentally, the drive voltage Vtxr applied to the transfer electrode 44 is set to the on-potential except for a period during which the other drive voltages $Vtx_1$ and $Vtx_2$ are initially set to the on-potential and then finally set to the off-potential. That is, the drive voltage Vtxr is set to the off-potential between the times $t_0$ and $t_8$ in the first frame F1, is set to the off potential between the times $t_1$ and $t_9$ in the second frame F2, and is set to the on-potential in the other periods.

In other words, the above operation is performed as follows. In the first frame F1, the drive voltage $Vtx_1$ rises at a timing earlier by $(t_L/2)$ than the rise timing of the driving clock CL. Hereinafter, a phase of the drive voltage $Vtx_1$ in the first frame F1 is set to 0°. In the same first frame F1, the drive voltage $Vtx_2$ rises at a timing later by $t_L$ than the rise timing of the drive voltage $Vtx_1$. In other words, a phase of the drive voltage $Vtx_2$ in the first frame F1 is 180°. In the second frame F2, the drive voltage $Vtx_1$ rises at the same timing as the rise timing of the driving clock CL. In other words, a phase of the drive voltage $Vtx_1$ in the second frame F2 is 90°. In addition, in the same second frame F2, the drive voltage $Vtx_2$ rises at a timing later by $t_L$ than the rise timing of the drive voltage $Vtx_1$. In other words, a phase of the drive voltage $Vtx_2$ in the second frame F2 is 270°. Incidentally, FIG. 8 is a view illustrating the timing charts of the first frame F1 and the second frame F2 illustrated in FIGS. 7A and 7B for the one-time driving clock CL in an overlapping manner in order to facilitate understanding. A drive voltage $Vtx_1(1)$ and a drive voltage $Vtx_2(1)$ respectively represent the drive voltages $Vtx_1$ and $Vtx_2$ in the first frame F1, and a drive voltage $Vtx_1(2)$ and a drive voltage $Vtx_2(2)$ respectively represent the drive voltages $Vtx_1$ and $Vtx_2$ in the second frame F2.

FIGS. 9 and 10 further illustrate a chart of a light reception pulse waveform of the reflected light L2 in the timing chart illustrated in FIG. 8. As illustrated in FIG. 9, it is assumed that the reflected light L2 is incident on the pixel P (m, n) after a time $(t_L/3)$ has passed since the object is irradiated with light L1. At this time, in the first frame F1, charges corresponding to the area of a region $A_3$ in FIG. 9 are stored in the charge collection region 15, and charges corresponding to the area of a region $A_4$ are stored in the charge collection region 16. Assuming that the total charge amount generated by the reflected light L2 is Q, a charge amount stored in the charge collection region 15 is Q/6, and a charge amount stored in the charge collection region 16 is (5×Q/6). In addition, in the second frame F2, charges corresponding to the area of a region $A_5$ in the drawing are stored in the charge collection region 15, and charges corresponding to the area of a region $A_6$ are stored in the charge collection region 16. At this time, a charge amount stored in the charge collection region 15 is (2×Q/3), and a charge amount stored in the charge collection region 16 is Q/3. Then, the charge amount Q/6 of the charge collection region 15 in the first frame F1 is subtracted from the charge amount (5×Q/6) of the charge collection region 16 in the first frame F1, thereby obtaining a value of (2×Q/3). Similarly, the charge amount (2×Q/3) of the charge collection region 15 in the second frame F2 is subtracted from the charge amount Q/3 of the charge collection region 16 in the second frame F2, thereby obtaining a value of −Q/3. Then, when absolute values of these values are added, the total charge amount Q generated by the reflected light L2 is obtained.

Next, it is assumed that the reflected light L2 is incident on the pixel P (m, n) after a time $(3×t_L/4)$ has passed since the object is irradiated with the light L1 as illustrated in FIG. 10. At this time, in the first frame F1, charges corresponding to the area of a region $A_7$ in FIG. 10 are stored in the charge collection region 15, and a charge corresponding to the area of a region $A_8$ is stored in the charge collection region 16. At this time, a charge amount stored in the charge collection region 15 is Q/4, and a charge amount stored in the charge collection region 16 is (3×Q/4). In addition, in the second frame F2, charges corresponding to the area of a region $A_9$ in FIG. 10 are stored in the charge collection region 15, and charge corresponding to the area of a region $A_{10}$ are stored in the charge collection region 16. At this time, a charge amount stored in the charge collection region 15 is Q/4, and a charge amount stored in the charge collection region 16 is (3×Q/4). Then, the charge amount Q/4 of the charge collection region 15 in the first frame F1 is subtracted from the charge amount (3×Q/4) of the charge collection region 16 in the first frame F1, thereby obtaining a value of (Q/2). Similarly, the charge amount Q/4 of the charge collection region 15 in the second frame F2 is subtracted from the charge amount (3×Q/4) of the charge collection region 16 in the second frame F2, thereby obtaining a value of (Q/2). Then, when absolute values of these values are added, the total charge amount Q generated by the reflected light L2 is obtained.

As is apparent from the above example, it is possible to obtain the total charge amount Q generated by the reflected light L2 by adding the absolute value of the value obtained by subtracting the amount of charge collected at the phase 0°, that is, the times $t_0$ to $t_2$ and $t_4$ to $t_6$ from the amount of charge collected at phase 180°, that is, times $t_2$ and $t_4$ and $t_6$ and $t_8$ and the absolute value of the value obtained by subtracting the amount of charge collected at the phase 90°, that is, the times $t_1$ and $t_3$ and $t_5$ and $t_7$ from the amount of charge collected at the phase 270°, that is, the times $t_3$ and $t_5$ and $t_7$ and $t_9$. Therefore, it is possible to know the delay time $T_2$, that is, the distance to the object B by obtaining the ratio of the charge amounts stored in the charge collection regions 15 and 16 (the ratio of the charge amounts stored in the storage nodes coupled, respectively, to the charge collection regions 15 and 16) based on the total charge amount Q obtained in this manner and the difference between the charge amounts stored in the charge collection regions 15 and 16 obtained from the processing circuit 13.

According to the distance sensor 1A according to the present embodiment, it is possible to obtain the time $T_2$, that is, the distance to the object B based on the difference between the charge amounts stored in the storage nodes coupled, respectively, to the charge collection regions 15 and 16 as described above. Therefore, it is possible to adopt the use method of injecting the equal amount of current to each storage node, and as a result, it is possible to avoid saturation of each storage node. Hereinafter, an example of a circuit configuration for injection of the equal amount of current to each storage node will be described in detail.

Figure 11:
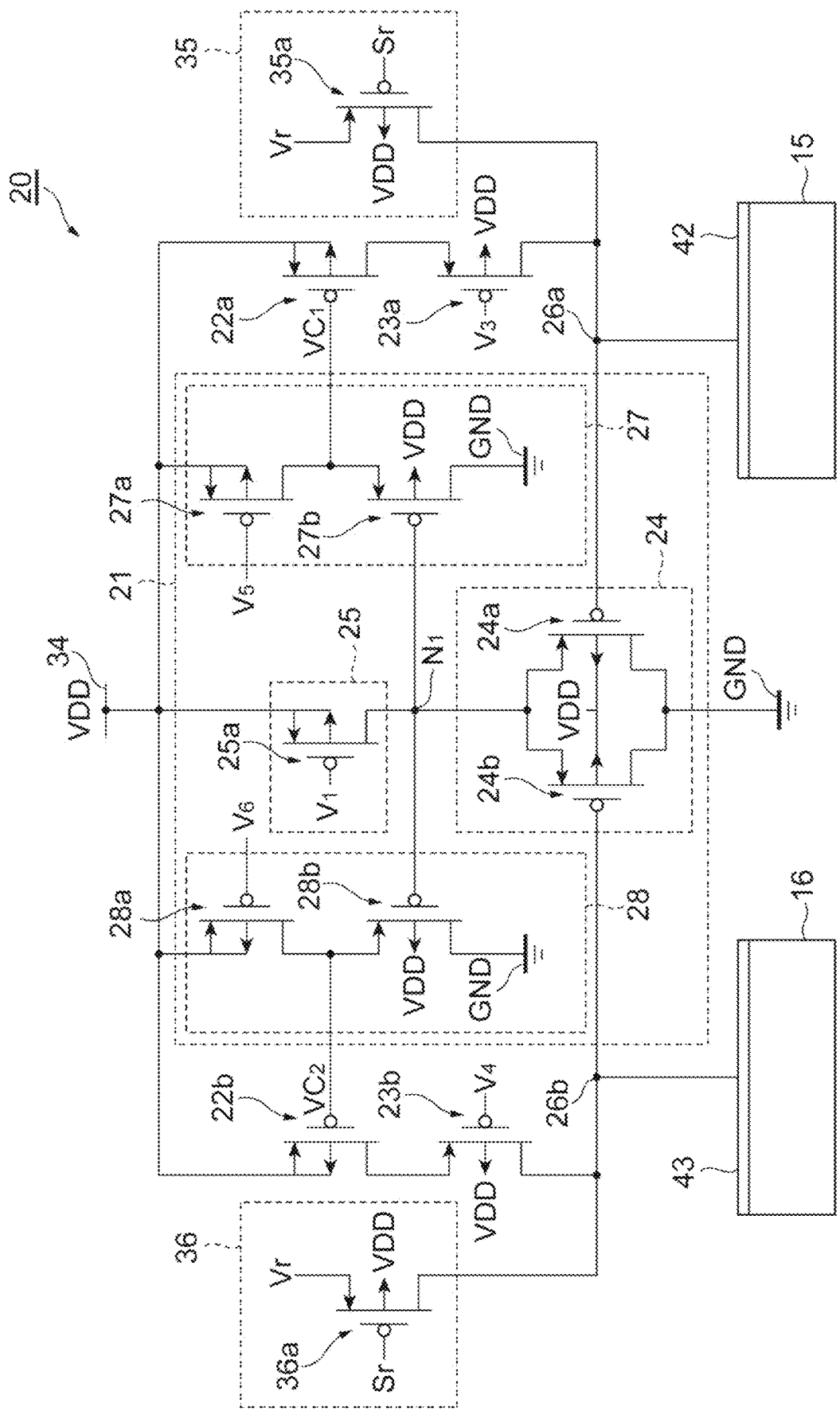
FIG. 11 is a circuit diagram illustrating a configuration of a current injection circuit according to one embodiment.

FIG. 11 is a circuit diagram illustrating a configuration of the current injection circuit 20 illustrated in FIG. 1. As illustrated in FIG. 11, the current injection circuit 20 of the present embodiment includes a voltage generation circuit 21, a transistor 22a (first transistor), a transistor 22b (second transistor), a transistor 23a (third transistor), and a transistor 23b (fourth transistor). The transistors 22a, 22b, 23a and 23b are field-effect transistors, for example, p-channel MOSFETs.

The voltage generation circuit 21 is disposed between a power supply potential line 34 (first constant potential line) and a reference potential line GND (second constant potential line) having a lower potential than the power supply potential line 34. The voltage generation circuit 21 generates control voltages $VC_1$ and $VC_2$ corresponding to a larger one between the charge amounts stored in the charge collection regions 15 and 16. Specifically, the voltage generation circuit 21 includes a transistor pair 24 and a current source 25 connected in series between the power supply potential line 34 and the reference potential line GND. Furthermore, the voltage generation circuit 21 has buffer circuits 27 and 28.

The transistor pair 24 includes a transistor 24a (fifth transistor) and a transistor 24b (sixth transistor). The transistors 24a and 24b are field-effect transistors, for example, p-channel MOSFETs. One current terminals (first current terminals) of the transistors 24a and 24b are electrically connected to the power supply potential line 34 via the current source 25 in the state of being short-circuited from each other. The other current terminals (second current terminals) of the transistors 24a and 24b are electrically connected to the reference potential line GND in the state of being short-circuited from each other. A control terminal of the transistor 24a is electrically connected to the signal extraction electrode 42 on the charge collection region 15 via a storage node 26a. A control terminal of the transistor 24b is electrically connected to the signal extraction electrode 43 on the charge collection region 16 via a storage node 26b. The storage node 26a stores the charge collected in the charge collection region 15, and the storage node 26b stores the charge collected in the charge collection region 16.

The current source 25 includes a transistor 25a. The transistor 25a is a field-effect transistor, for example, a p-channel MOSFET. One current terminal (first current terminal) of the transistor 25a is electrically connected to the power supply potential line 34. The other current terminal (second current terminal) of the transistor 25a is electrically connected to the first current terminal of each of the transistors 24a and 24b. A predetermined bias voltage (constant voltage) $V_1$ is applied to a control terminal of the transistor 25a. Incidentally, the current source may further include another transistor connected in parallel with the transistor 25a.

The transistor 22a supplies a current for eliminating a disturbance light component to avoid saturation of the storage node 26a to the storage node 26a. One current terminal (first current terminal) of the transistor 22a is connected to the power supply potential line 34, and the other current terminal (second current terminal) is connected to the storage node 26a via the transistor 23a. A control terminal of the transistor 22a is electrically connected to a node $N_1$ between the transistor pair 24 and the current source 25 via the buffer circuit 27.

The transistor 22b supplies the current for eliminating the disturbance light component to the storage node 26b. One current terminal (first current terminal) of the transistor 22b is connected to the power supply potential line 34, and the other current terminal (second current terminal) is connected to the storage node 26b via the transistor 23b. A control terminal of the transistor 22b is connected to the node $N_1$ via the buffer circuit 28.

The transistor 23a is cascode-connected to the transistor 22a, and prevents an operation of the transistor 22a from being affected by a fluctuation of a potential of the storage node 26a. Specifically, one current terminal (first current terminal) of the transistor 23a is connected to the second current terminal of the transistor 22a, and the other current terminal (second current terminal) of the transistor 23a is connected to the storage node 26a. A predetermined bias voltage (constant voltage) $V_3$ is applied to a control terminal of the transistor 23a.

The transistor 23b is cascode-connected to the transistor 22b and prevents an operation of the transistor 22b from being affected by a fluctuation of a potential of the storage node 26b. Specifically, one current terminal (first current terminal) of the transistor 23b is connected to the second current terminal of the transistor 22b, and the other current terminal (second current terminal) of the transistor 23b is connected to the storage node 26b. A predetermined bias voltage (constant voltage) $V_4$ is applied to a control terminal of the transistor 23b. As an example, the bias voltage $V_3$ and the bias voltage $V_4$ may be made equal to each other.

The buffer circuit 27 shifts a potential of the node $N_1$ to generate a control voltage $VC_1$ and provides the generated control voltage to the control terminal of the transistor 22a. The buffer circuit 27 is configured to include, for example, a source follower circuit. Specifically, the buffer circuit 27 has transistors 27a and 27b connected in series to each other. One current terminal (first current terminal) of the transistor 27a is connected to the power supply potential line 34, and the other current terminal (second current terminal) is connected to one current terminal (first current terminal) of the transistor 27b. The other current terminal (second current terminal) of the transistor 27b is connected to the reference potential line GND. A predetermined bias voltage (constant voltage) $V_5$ is applied to a control terminal of the transistor 27a. The potential of the node $N_1$ is input to a control terminal of the transistor 27b. The buffer circuit 27 outputs the control voltage $VC_1$ having a magnitude corresponding to the potential of the node $N_1$ from the node between the transistors 27a and 27b.

The buffer circuit 28 shifts the potential of the node $N_1$ to generate a control voltage $VC_2$ and provides the generated control voltage to the control terminal of the transistor 22b. The buffer circuit 28 is configured to include, for example, a source follower circuit. Specifically, the buffer circuit 28 has transistors 28a and 28b connected in series to each other. One current terminal (first current terminal) of the transistor 28a is connected to the power supply potential line 34, and the other current terminal (second current terminal) is connected to one current terminal (first current terminal) of the transistor 28b. The other current terminal (second current terminal) of the transistor 28b is connected to the reference potential line GND. A predetermined bias voltage (constant voltage) $V_6$ is applied to a control terminal of the transistor 28a. The potential of the node $N_1$ is input to a control terminal of the transistor 28b. The buffer circuit 28 outputs the control voltage $VC_2$ having a magnitude corresponding to the potential of the node $N_1$ from the node between the transistors 28a and 28b. Magnitudes of the bias voltages $V_5$ and $V_6$ are set such that the amount of current supplied from the transistor 22a to the storage node 26a and the amount of current supplied from the transistor 22b to the storage node 26b are equal to each other. As an example, $V_5=V_6$ may be set.

Incidentally, the buffer circuits 27 and 28 may be omitted. In such a case, the control terminals of the transistors 22a and 22b are directly connected to the node $N_1$, and the potential of the node $N_1$ is provided to these control terminals as the control voltages $VC_1$ and $VC_2$.

The current injection circuit 20 further includes reset circuits 35 and 36. The reset circuit 35 has a transistor 35a, and the reset circuit 36 has a transistor 36a. A reset potential Vr is input to one current terminal (first current terminals) of each of the transistors 35a and 36a. The other current terminal (second current terminal) of the transistor 35a is connected to the storage node 26a, and the other current terminal (second current terminal) of the transistor 36a is connected to the storage node 26b. A reset signal Sr is input to a control terminal of each of the transistors 35a and 36a, and the charges of the storage nodes 26a and 26b are discharged as the transistors 35a and 36a are turned into on-states.

An operation of the current injection circuit 20 having the above configuration will be described. When the reflected light L2 is incident on the pixel P (m, n), the charges flow into the charge collection regions 15 and 16 at the ratio corresponding to the distance to the object B (see FIGS. 5A to 5C). In addition, the charges corresponding to the magnitude of the disturbance light incident on the pixel P (m, n) also flow into the charge collection regions 15 and 16. However, when the on-time of the drive voltage applied to the transfer electrode 17 and the on-time of the drive voltage applied to the transfer electrode 18 are equal to each other, the charge amounts flowing into the charge collection regions 15 and 16 due to the disturbance light are equal to each other.

As a result, potentials of the storage nodes 26a and 26b have magnitudes corresponding to the charge amounts flowing into the charge collection regions 15 and 16, respectively. Then, when the charges continue to flow into the charge collection regions 15 and 16 and one of the potentials of the storage nodes 26a and 26b exceeds a turn-on voltage, one of the transistors 24a and 24b starts to flow a current according to the potential of the one storage node. Therefore, the potential of the node $N_1$ has a magnitude corresponding to a larger one between the charge amounts stored in the charge collection regions 15 and 16 (storage nodes 26a and 26b). The control voltages $VC_1$ and $VC_2$ having magnitudes corresponding to the potential of the node $N_1$ are output, respectively, to the control terminals of the transistors 22a and 22b.

The transistors 22a and 22b receive the above control voltages $VC_1$ and $VC_2$ at their control terminals and cause current corresponding to each magnitude of the control voltages $VC_1$ and $VC_2$ to flow. Here, since the predetermined bias voltages $V_3$ and $V_4$ are constantly applied to the control terminals of the transistors 23a and 23b, respectively, the current from each of the transistors 23a and 23b is injected into each of the storage nodes 26a and 26b. As a result, the same amount of charge is offset at the storage nodes 26a and 26b, and the saturation of the storage nodes 26a and 26b (charge collection regions 15 and 16) caused by the disturbance light is avoided.

Figure 12:
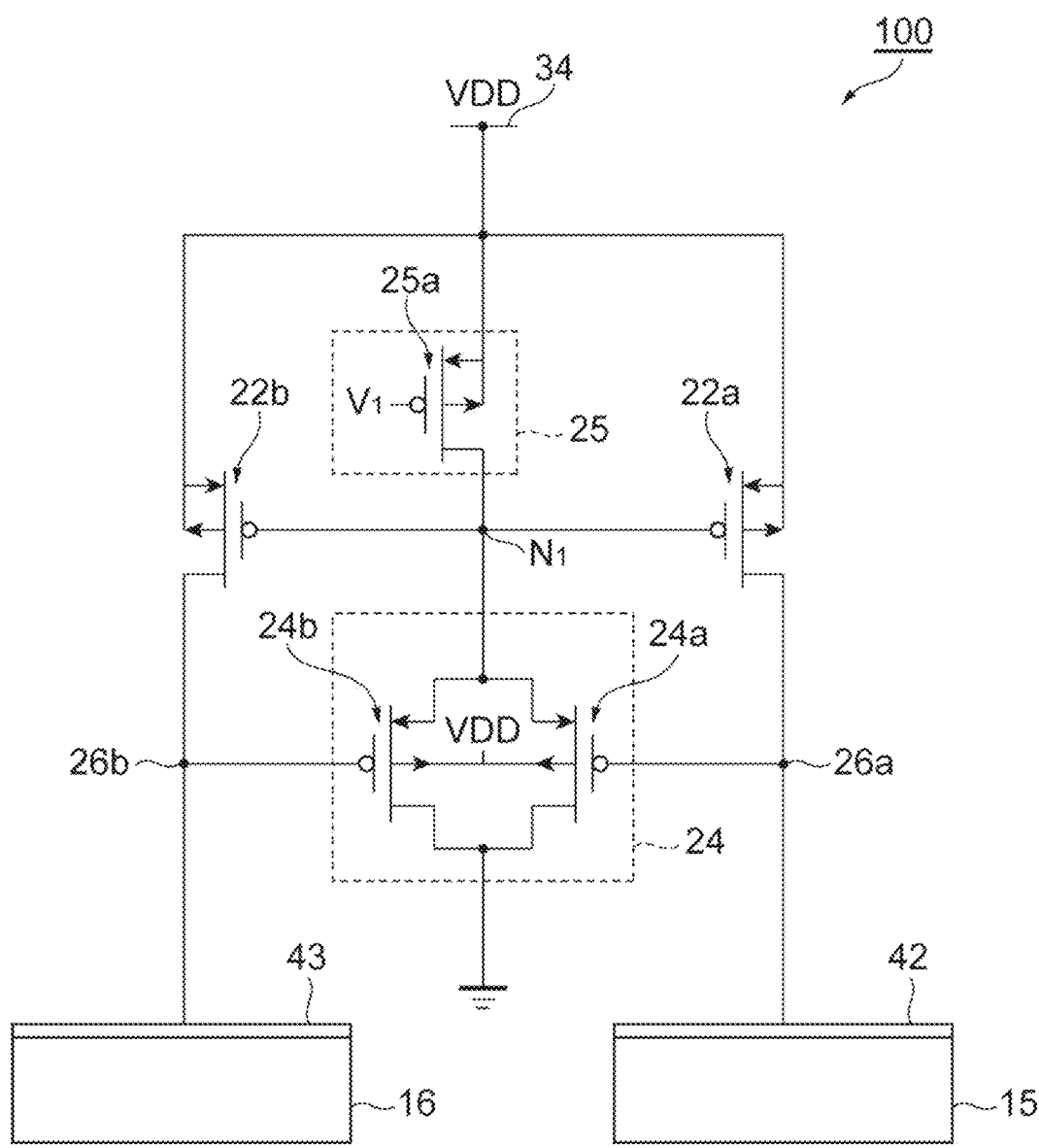
FIG. 12 is a circuit diagram illustrating a configuration of a current injection circuit according to a comparative example.

Effects that can be obtained by the distance sensor 1A according to the present embodiment as described above will be described. FIG. 12 is a circuit diagram illustrating a configuration of a current injection circuit 100 according to a comparative example. The current injection circuit 100 has the same configuration as the current injection circuit 20 of the present embodiment except that the transistors 23a and 23b and the buffer circuits 27 and 28 are not provided. Incidentally, the reset circuits 35 and 36 are not illustrated.

In the current injection circuit 100 illustrated in FIG. 12, the transistors 22a and 22b are directly connected to the storage nodes 26a and 26b, but potentials of storage nodes 26a and 26b vary depending on the charge amounts stored in charge collection regions 15 and 16. Therefore, a difference also occurs between the potentials of the storage nodes 26a and 26b depending on the difference between the charge amounts stored in the charge collection regions 15 and 16. That is, a difference occurs between drain-source voltages of the transistors 22a and 22b. Thus, the amount of charge injected into the storage node 26a and the amount of charge injected into the storage node 26b are not equal to each other so that a slight difference occurs therebetween due to characteristics (channel length modulation effects) of the transistors 22a and 22b. As a result, an error occurs when the processing circuit 13 outputs the difference between the charge amounts stored in charge collection regions 15 and 16 so that an error occurs in the measured distance.

With respect to such a problem, cascode devices such as transistors 23a and 23b are disposed between each of the transistors 22a and 22b and each of the storage nodes 26a and 26b in the distance sensor 1A according to the present embodiment. As a result, the potential of each of the transistors 22a and 22b and the potential of each of the storage nodes 26a and 26b are separated, and thus, even if there is a potential difference between the storage node 26a and the storage node 26b, the influence on the drain-source voltage of each of the transistors 22a and 22b can be suppressed (the drain-source voltages of the transistors 22a and 22b can be made equal to each other). Therefore, it is possible to reduce the difference in the amounts of current injected from the transistors 22a and 22b into the corresponding storage nodes 26a and 26b (charge collection regions 15 and 16), and it is possible to accurately control these injected current amounts to a substantially uniform magnitude.

Figure 13A:
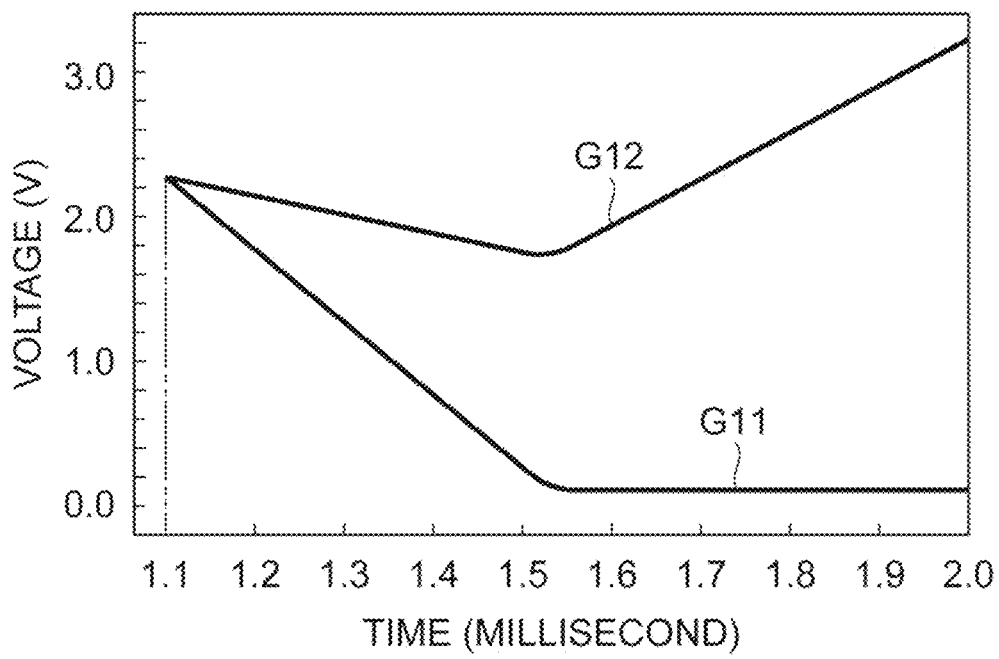
FIG. 13A is a graph illustrating an example of a temporal change of a voltage value (potential) of each storage node in the current injection circuit according to the comparative example.
Figure 13B:
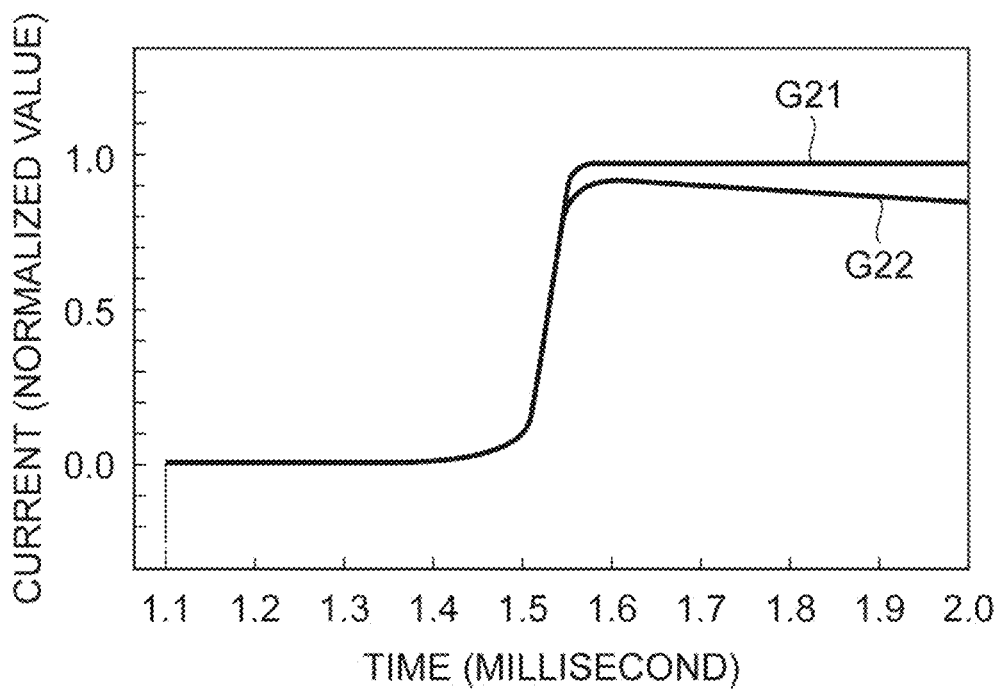
FIG. 13B is a graph illustrating an example of a temporal change of the amount of injected current to each storage node in the current injection circuit according to the comparative example.

Here, FIG. 13A is a graph illustrating an example of a temporal change of a voltage value (potential) of each of the storage nodes 26a and 26b in the current injection circuit 100 according to the comparative example. In FIG. 13A, a graph G11 indicates the voltage value of one storage node and a graph G12 indicates the voltage value of the other storage node. In addition, FIG. 13B is a graph illustrating an example of a temporal change of the amount of current injected to each of the storage nodes 26a and 26b in the current injection circuit 100 according to the comparative example. In FIG. 13B, a graph G21 indicates the amount of current injected to one storage node and a graph G22 indicates the amount of current injected to the other storage node.

As illustrated in FIG. 13A, the potentials of the storage nodes 26a and 26b are gradually decreased due to storage of charges in the storage nodes 26a and 26b. Further, when the potential of one storage node exceeds a turn-on voltage of the transistor 24a (or 24b), current injection to each of the storage nodes 26a and 26b is started (1.5 to 1.6 milliseconds) as illustrated in FIG. 13B. As a result, the potential of one storage node stops decreasing and becomes constant, and the potential of the other storage node starts to increase.

However, the injected current amounts to the respective storage nodes slightly differ from each other due to the potential difference between the storage node 26a and the storage node 26b as described above. As a result, the graph G21 and the graph G22 gradually diverge. Such a difference in the amounts of injected current appears as a measurement error.

Figure 14A:
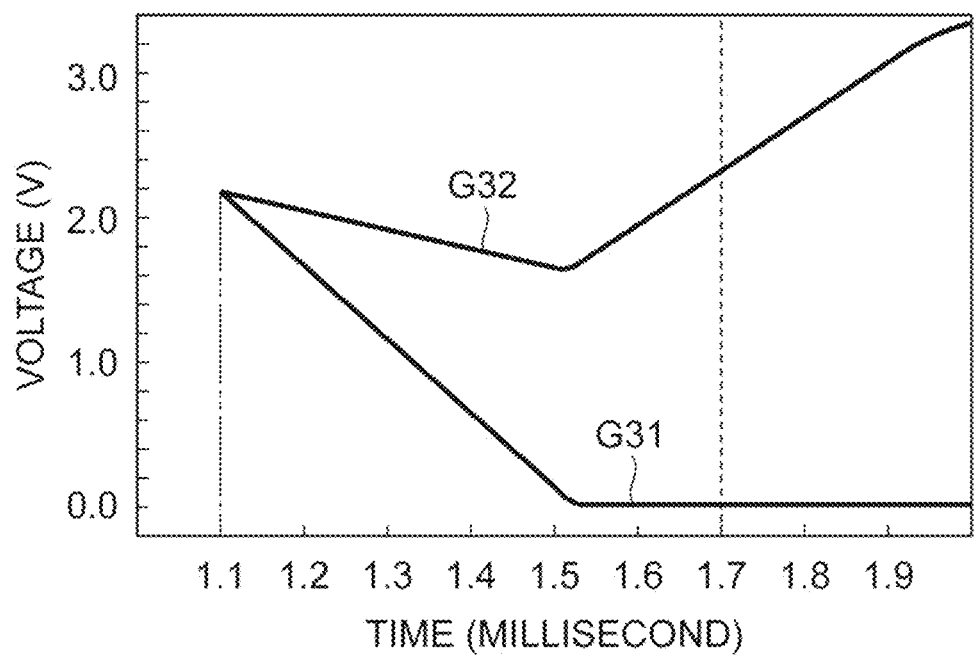
FIG. 14A is a graph illustrating an example of a temporal change of a voltage value (potential) of each storage node in the current injection circuit according to one embodiment.
Figure 14B:
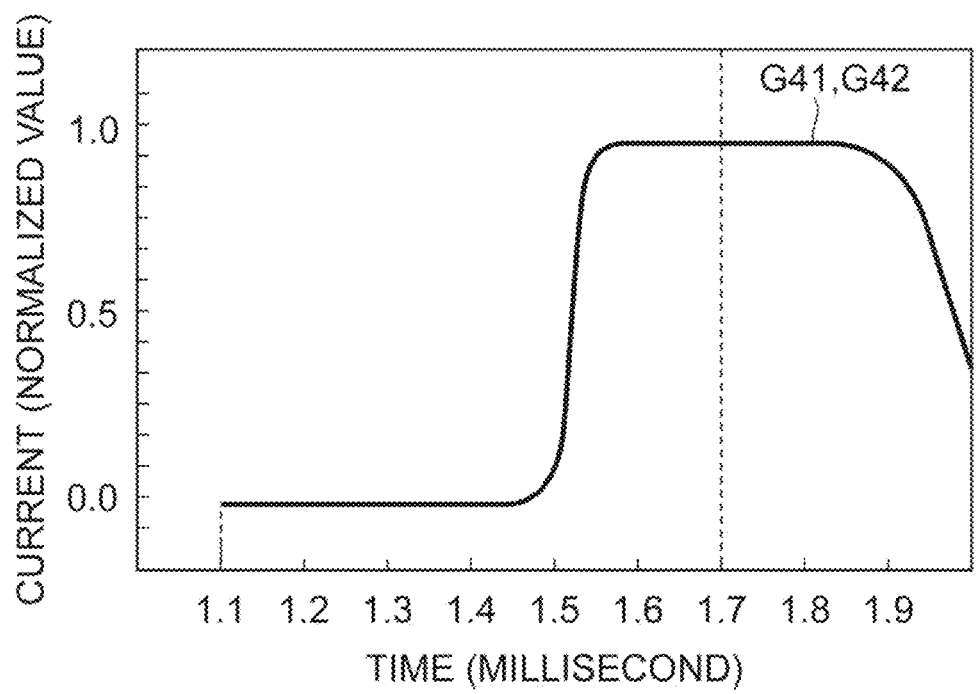
FIG. 14B is a graph illustrating an example of a temporal change of the amount of injected current to each storage node in the current injection circuit according to one embodiment.

On the other hand, FIG. 14A is a graph illustrating an example of a temporal change of a voltage value (potential) of each of the storage nodes 26a and 26b in the current injection circuit 20 according to the present embodiment. In FIG. 14A, a graph G31 indicates the voltage value of one storage node and a graph G32 indicates the voltage value of the other storage node. In addition, graphs G41 and G42 in FIG. 14B illustrate examples of temporal changes of injected current amounts to the storage nodes 26a and 26b, respectively, in the current injection circuit 20 of the present embodiment. Since the injected current amounts to the storage nodes 26a and 26b are equal to each other, the graphs G41 and G42 are completely overlapped.

As described above, the potential difference between the storage node 26a and the storage node 26b is reduced, and it is possible to make the injected current amounts to the storage nodes approximate to each other according to the present embodiment. Therefore, it is possible to reduce the measurement error according to the present embodiment.

In addition, each of the transistors 23a and 23b is preferably the MOSFET as in the present embodiment. As a result, it is possible to appropriately separate the potential of each of the transistors 22a and 22b from the potential of each of the storage nodes 26a and 26b. In particular, this is effective when each of the transistors 22a and 22b is the MOSFET as in the present embodiment.

(First Modification)

FIGS. 15A and 15B are views illustrating timing charts of a driving method according to a first modification of the above embodiment. The sensor drive circuit 12 of the above embodiment may drive the transfer electrodes 17 and 18 based on the timing charts illustrated in FIGS. 15A and 15B instead of the timing charts illustrated in FIGS. 7A and 7B.

A difference between the timing chart of the first modification and the timing chart of the above embodiment is a length of an on-time of the drive voltages $Vtx_1$ and $Vtx_2$. In the above embodiment, the on-time (period during which a transfer electrode is set to an on-voltage) of the drive voltages $Vtx_1$ and $Vtx_2$ is equal to the on-time of the driving clock CL (that is, the irradiation time of the irradiation light L1) $t_L$; however, the on-time of the drive voltages $Vtx_1$ and $Vtx_2$ is half the time $t_L$ ($t_L/2$) in the present modification.

Specifically, equally-spaced times $t_0, t_1, \ldots,$ and $t_8$ are defined in the storage frame F3 of each of the first frame F1 and the second frame F2 as illustrated in FIGS. 15A and 15B. An interval among these times is half of one-time irradiation time $t_L$ of the irradiation light L1. At this time, the light source unit 30 emits the irradiation light L1 for the times $t_1$ to $t_3$. Then, the sensor drive circuit 12 sets the drive voltage $Vtx_1$ to the on-potential between the times $t_0$ and $t_1$ and between the times $t_4$ and $t_5$ and the drive voltage $Vtx_2$ to the on-potential between the times $t_2$ and $t_3$ and between the times $t_6$ and $t_7$ in the first frame F1 as illustrated in FIG. 15A. In addition, the sensor drive circuit 12 sets the drive voltage $Vtx_1$ to the on-potential between the times $t_1$ and $t_2$ and between the times $t_5$ and $t_6$ and the drive voltage $Vtx_2$ to the on-potential between the times $t_3$ and $t_4$ and between the times $t_7$ and $t_8$ in the second frame F2 as illustrated in FIG. 15B.

Incidentally, the drive voltage Vtxr applied to the transfer electrode 44 is set to the on-potential except for a period during which the other drive voltages $Vtx_1$ and $Vtx_2$ are initially set to the on-potential and then finally set to the off-potential. That is, the drive voltage Vtxr is set to the off-potential between the times $t_0$ and $t_7$ in the first frame F1, is set to the off-potential between the times $t_1$ and $t_8$ in the second frame F2, and is set to the on-potential in the other periods.

A driving system of the first modification can obtain a value of ½ of the total charge amount generated by the reflected light L2 by obtaining absolute values of a difference between output values of the first frame F1 and a difference between output values of the second frame F2 and selecting the absolute value of the larger one. In addition, a sign of the output value of the first frame F1 and a sign of the output value of the second frame F2 are appropriately inverted, and an appropriate offset is added, thereby obtaining a value linearly increasing according to the time $T_2$.

Figure 16A:
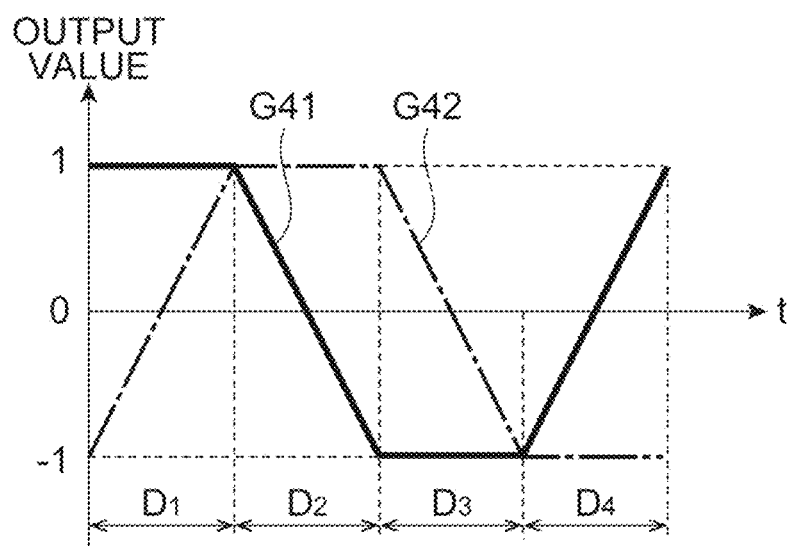
FIGS. 16A to 16C are views for describing a distance calculation method according to the first modification.
Figure 16B:
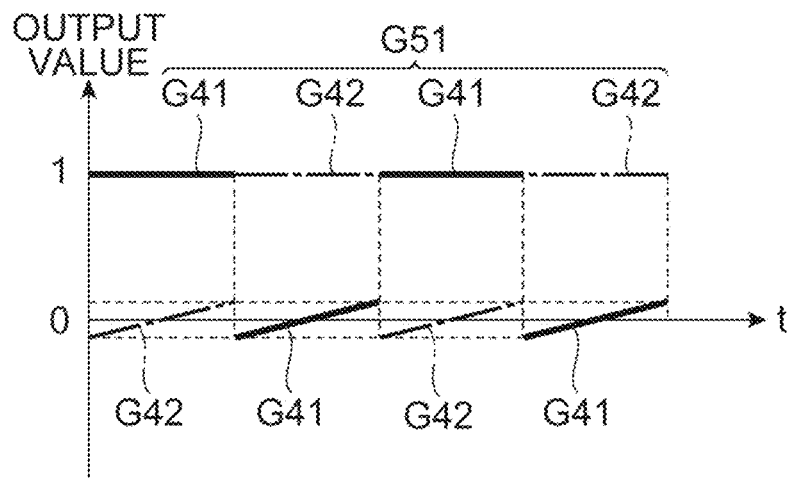
Figure 16C:
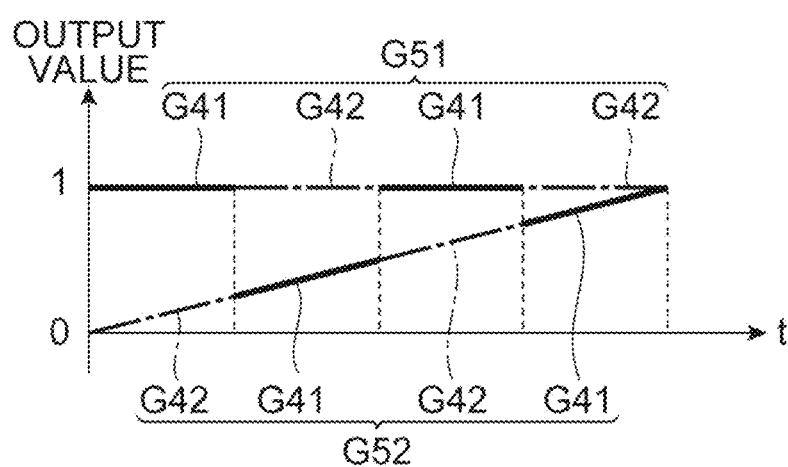

FIGS. 16A to 16C are views for describing a distance calculation method in the first modification. FIG. 16A is a graph illustrating a relationship between a value obtained by subtracting a charge amount of a storage node coupled to the charge collection region 15 from a charge amount of a storage node coupled to the charge collection region 16 (that is, an output value from each of the pixels P (m, n)) and the time t from irradiation of the light L1 to incidence of the reflected light L2 (that is, a distance to the object B). In FIG. 16A, a graph G41 indicates the output value in the first frame F1 and a graph G42 indicates the output value in the second frame F2. Incidentally, the output value is normalized so as to have a maximum value of 1 and a minimum value of −1 for convenience.

As indicated by the graph G41 of FIG. 16A, in the first frame F1, the output value is constant as 1 in a section $D_1$ of $0 < t < t_L/2$, the output value decreases from 1 to −1 in a section $D_2$ of $t_L/2 < t < t_L$, the output value is constant as −1 in a section $D_3$ of $t_L < t < (3 \times t_L/2)$, and the output value increases from −1 to 1 in a section $D_4$ of $(3 \times t_L/2) < t < 2t_L$. In addition, as indicated by the graph G42, in the second frame F2, the output value increases from −1 to 1 in the section $D_1$, the output value is constant as 1 in the section $D_2$, the output value decreases from 1 to −1 in the section $D_3$, and the output value is constant as −1 in the section $D_4$.

Here, absolute values of the respective output values of the first frame F1 and the second frame F2 are obtained, and the absolute value of the larger one between the output values of the first frame F1 and the second frame F2 is selected. Then, a graph G51 having a constant value regardless of the time t is obtained as illustrated in FIG. 16B. This graph G51 represents ½ of the total charge amount generated by the reflected light L2.

Meanwhile, a sign of a smaller absolute value between the output values of the first frame F1 and the second frame F2 is inverted in a section where the output value (graph G41) of the first frame F1 is smaller than the output value (graph G42) of the second frame F2 among the respective sections $D_1$ to $D_4$. In the example of FIG. 16A, signs of the output value of the first frame F1 in the section $D_2$ and the output value of the second frame F2 in the section $D_3$ are inverted. As a result, both the output value of the second frame F2 in the sections $D_1$ and $D_3$ and the output value of the first frame F1 in the sections $D_2$ and $D_4$ have a positive slope with respect to the time t. Then, both of the output value of the second frame F2 in the sections $D_1$ and $D_3$ and the output value of the first frame F1 in the sections $D_2$ and $D_4$ are multiplied by ¼ as illustrated in FIG. 16B. Finally, an appropriate offset value is added to each of the output value of the second frame F2 in the sections $D_1$ and $D_3$ and the output value of the first frame F1 in the sections $D_2$ and $D_4$, thereby obtaining a linear graph G52 in which the output value increases from 0 to 1 in a range of $0 \leq t \leq 2t_L$ as illustrated in FIG. 16C. As a result, it is possible to know the time t, that is, the distance to the object B, based on the graph G51 and the graph G52. Incidentally, the order of the respective operations illustrated in FIGS. 16A to 16C is not limited to the above-described one, and may be performed in a different order. Alternatively, the respective operations illustrated in FIGS. 16A to 16C may be performed at the same time.

According to this first modification, the distance to the object B can be obtained based on the difference between the charge amounts stored in the storage nodes coupled, respectively, to the charge collection regions 15 and 16 similarly to the above embodiment. Therefore, it is possible to apply the current injection circuit 20 of the above embodiment, and as a result, it is possible to avoid saturation of each storage node.

(Second Modification)

Figure 17:
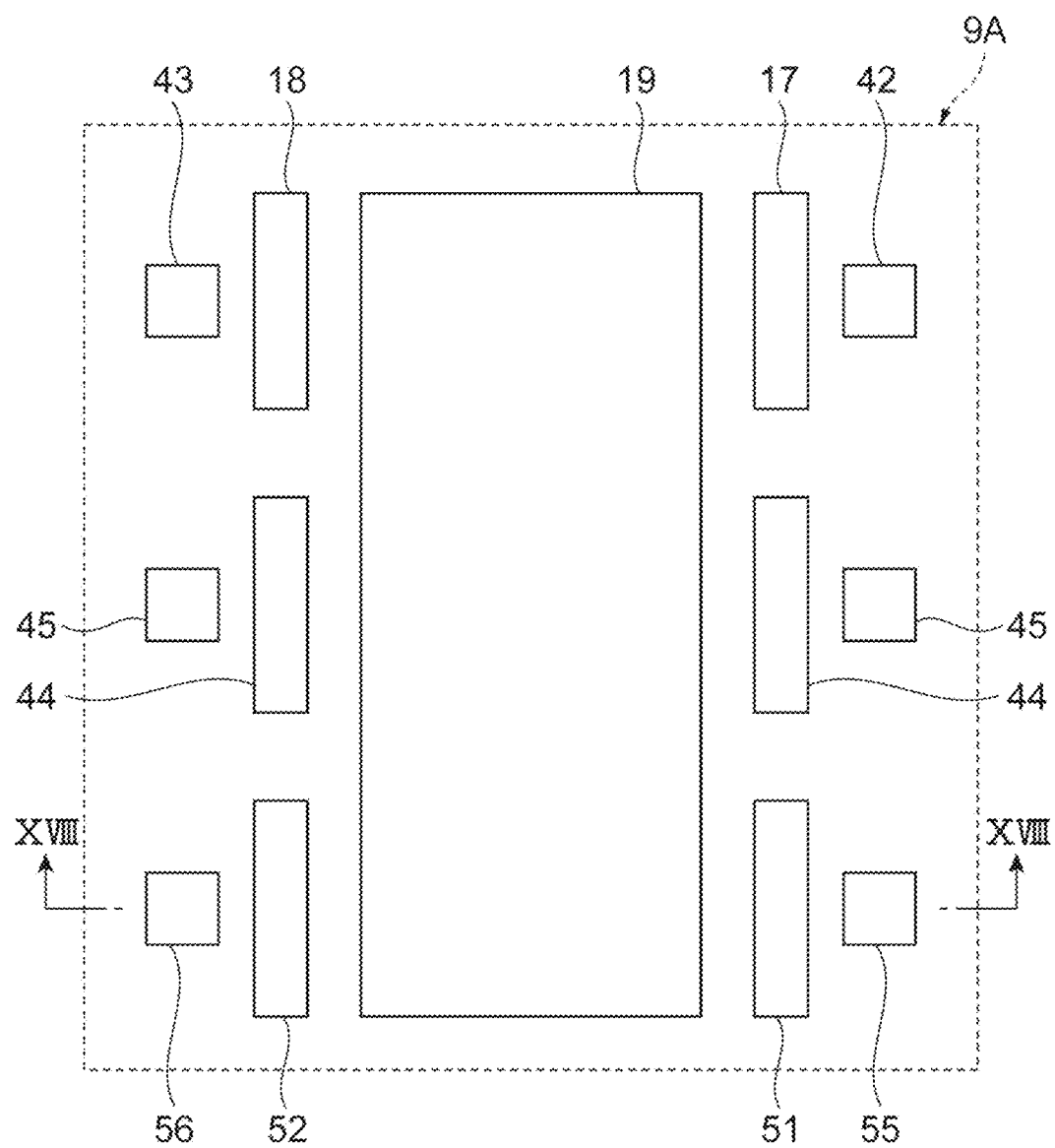
FIG. 17 is a plan view illustrating a light receiving unit according to a second modification.

FIG. 17 is a plan view illustrating a light receiving unit 9A according to a second modification of the above embodiment. As illustrated in FIG. 17, the light receiving unit 9A of the present modification includes each one of the transfer electrode 17 (first transfer electrode), the transfer electrode 18 (second transfer electrode), a transfer electrode 51 (first transfer electrode), and a transfer electrode 52 (second transfer electrode). These transfer electrodes 17, 18, 51, and 52 are disposed around the photogate electrode 19 to be adjacent to the photogate electrode 19. Incidentally, the photogate electrode 19 is positioned between the transfer electrode 17 and the transfer electrode 18 in the second modification, and the photogate electrode 19 is positioned between the transfer electrode 51 and the transfer electrode 52, but there is no restriction on a positional relationship among the transfer electrodes 17, 18, 51, and 52 as long as the transfer electrodes are adjacent to the photogate electrode 19.

In addition, the light receiving unit 9A has each one of signal extraction electrodes 42, 43, 55, and 56. The transfer electrode 17 is disposed between the signal extraction electrode 42 and the photogate electrode 19, the transfer electrode 18 is disposed between the signal extraction electrode 43 and the photogate electrode 19, the transfer electrode 51 is disposed between the signal extraction electrode 55 and the photogate electrode 19, and the transfer electrode 52 is disposed between the signal extraction electrode 56 and the photogate electrode 19. In addition, the light receiving unit 9A has the transfer electrode 44 and the charge discharging electrode 45.

Figure 18:
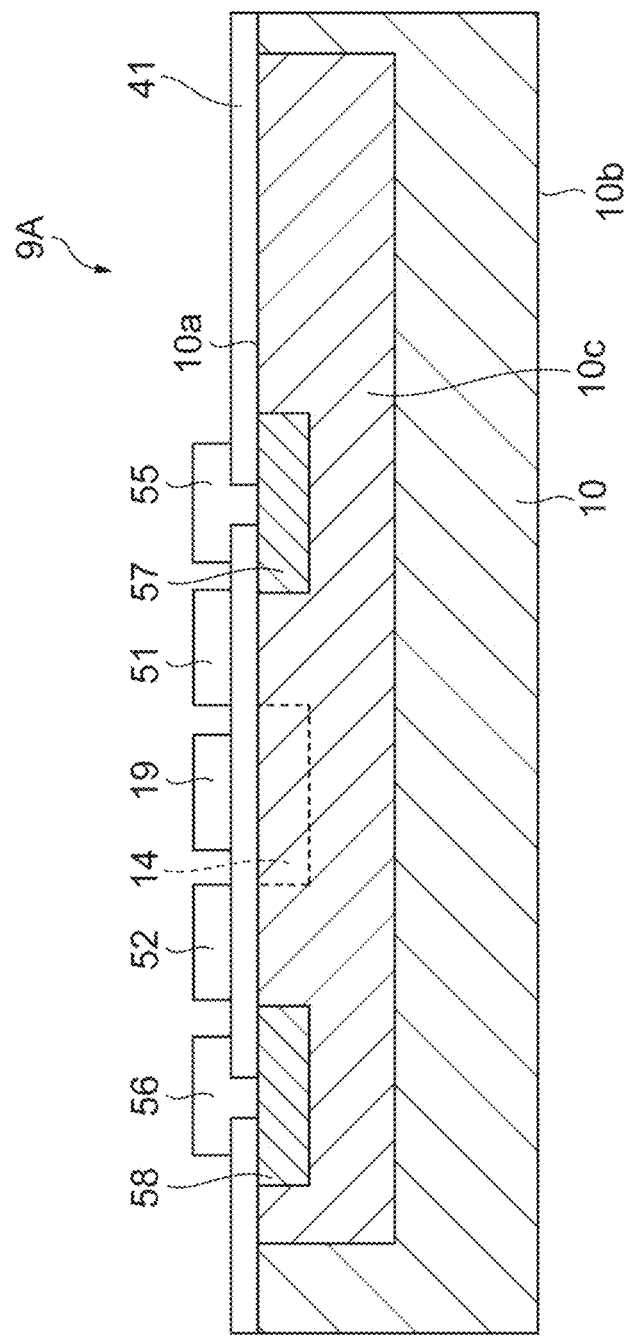
FIG. 18 is a cross-sectional view taken along a line XVIII-XVIII of FIG. 17.

In the light receiving unit 9A, a configuration immediately below the transfer electrodes 17 and 18 and the signal extraction electrodes 42 and 43 is the same as that in FIG. 3, and a configuration immediately below the transfer electrode 44 and the charge discharging electrode 45 is the same as that in FIG. 4. FIG. 18 is a cross-sectional view taken along a line XVIII-XVIII of FIG. 17, including a configuration immediately below the transfer electrodes 51 and 52 and the signal extraction electrodes 55 and 56. As illustrated in FIG. 18, the light receiving unit 9A further has a charge collection region 57 (first charge collection region), and a charge collection region 58 (second charge collection region). In the example of FIG. 18, the charge collection regions 57 and 58 are disposed so as to be adjacent to the photosensitive region 14 in a state of sandwiching the photosensitive region 14. The charge collection regions 57 and 58 collect charges from the photosensitive region 14 so that the charges are stored in storage nodes coupled, respectively, to the charge collection regions 57 and 58. Incidentally, configurations of the charge collection regions 57 and 58 are the same as those of the charge collection regions 15 and 16 illustrated in FIG. 3.

The signal extraction electrode 55 is formed on the charge collection region 57, and the signal extraction electrode 56 is formed on the charge collection region 58. The signal extraction electrodes 55 and 56 are in contact with the respective charge collection regions 57 and 58, respectively, through openings formed in the insulating layer 41.

The transfer electrode 51 is disposed on a region between the photosensitive region 14 and the charge collection region 57. The transfer electrode 52 is disposed on a region between the photosensitive region 14 and the charge collection region 58. When a positive potential (on-potential) is applied to the transfer electrode 51, electrons fall from the photosensitive region 14 into a potential well of the charge collection region 57 (charges are stored in the well). Similarly, when a positive potential (on-potential) is applied to the transfer electrode 52, electrons fall from the photosensitive region 14 into a potential well of the charge collection region 58.

Figure 19:
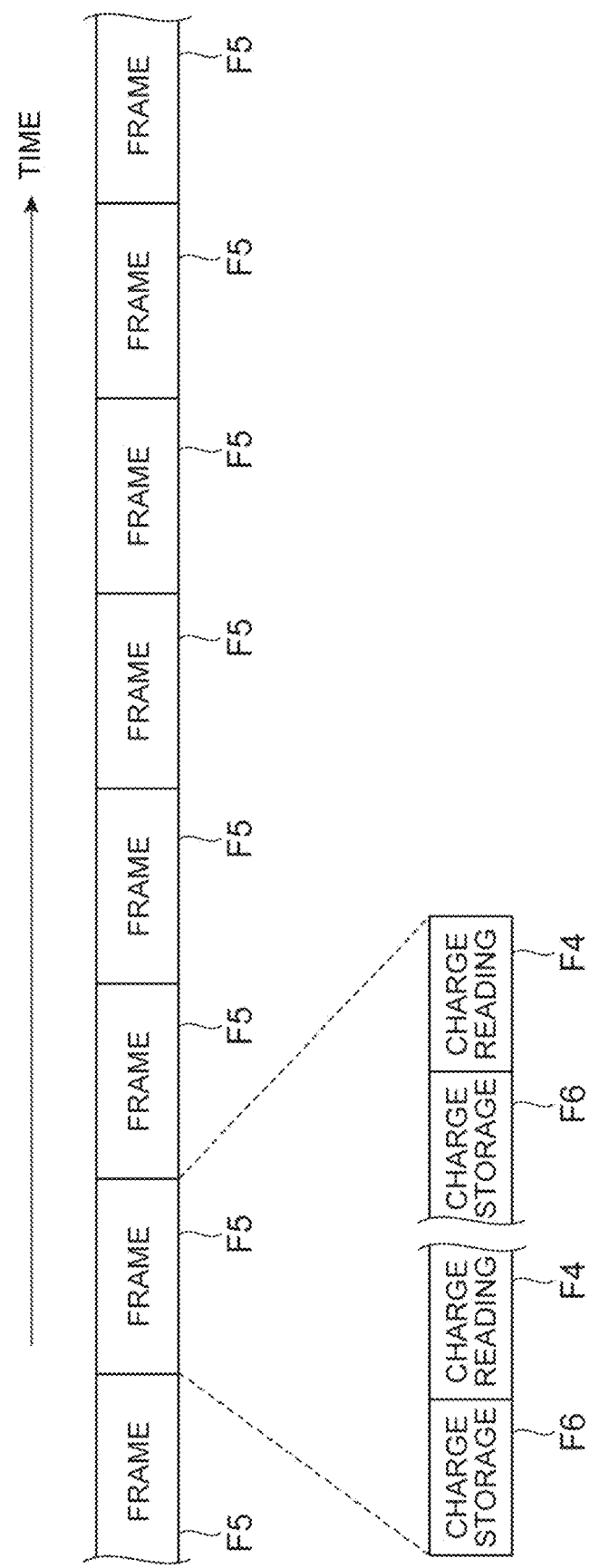
FIG. 19 is a view illustrating a driving system of a sensor drive circuit according to the second modification.

The sensor drive circuit according to the second modification drives the transfer electrodes 17, 18, 51, and 52 by sequentially executing a plurality of time-divided frames (each of which represents a drive pattern of a transfer electrode). FIG. 19 is a view illustrating a driving system of the sensor drive circuit according to the second modification. As illustrated in FIG. 19, an identical frame F5 is repeated and processing in the frame F5 is performed in the driving system of the second modification. FIG. 19 also illustrates processing contents within the frame F5. Within the frame F5, a storage frame F6 to perform charge storage into storage nodes coupled, respectively, to the charge collection regions 15, 16, 57, and 58 and a reading frame F4 to perform charge reading from the charge collection regions 15, 16, 57, and 58 are alternately repeated.

Figure 20:
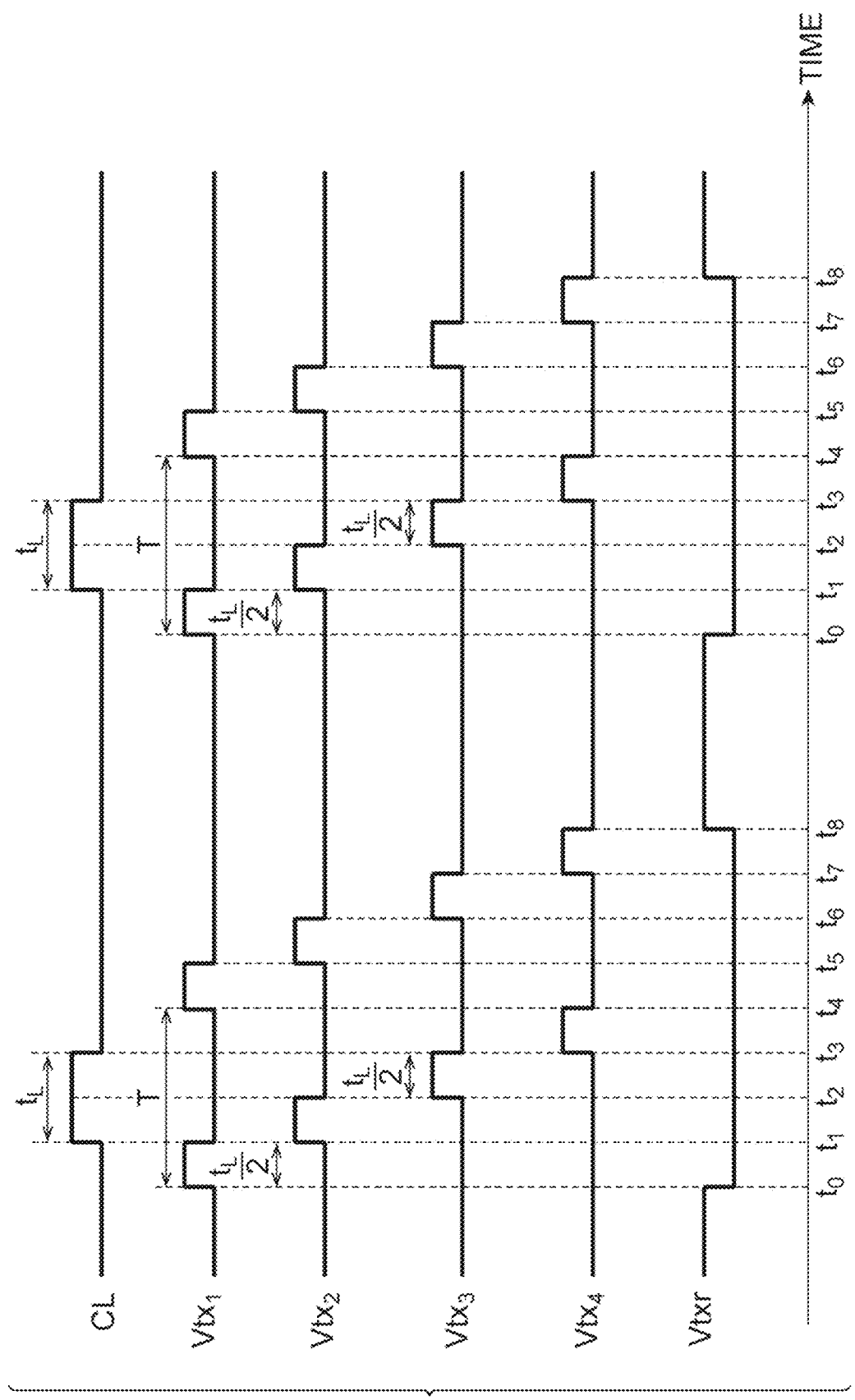
FIG. 20 is a timing chart illustrating an operation of a transfer electrode in a storage frame.

FIG. 20 is a timing chart illustrating operations of the transfer electrodes 17, 18, 44, 51, and 52 in the storage frame F6. This drawing illustrates the driving clock CL, the drive voltage $Vtx_1$ applied to the transfer electrode 17, the drive voltage $Vtx_2$ applied to the transfer electrode 18, a drive voltage $Vtx_3$ applied to the transfer electrode 51, a drive voltage $Vtx_4$ applied to the transfer electrode 52, and the drive voltage Vtxr applied to the transfer electrode 44.

In the storage frame F6, the drive voltages $Vtx_1$ to $Vtx_4$ are repeatedly switched between the on-potential and the off-potential twice at a certain cycle T each time the driving clock CL rises once. The cycle T is set to twice an on-time $t_L$ of the driving clock CL (for example, $T=2t_L$). In addition, an on-time of the drive voltages $Vtx_1$ to $Vtx_2$ in each cycle is half of the on-time $t_L$ ($t_L/2$) of the driving clock CL.

Specifically, equally-spaced times $t_0, t_1, \ldots,$ and $t_8$ are defined in the storage frame F6 of each of the frames F5 as illustrated in FIG. 20. An interval among these times is half of one-time irradiation time $t_L$ of the irradiation light L1. At this time, the light source unit 30 emits the irradiation light L1 for the times $t_1$ to $t_3$. Then, in each of the frames F5, the sensor drive circuit 12 sets the drive voltage $Vtx_1$ to the on-potential between the times $t_0$ and $t_1$ and between the times $t_4$ and $t_5$, the drive voltage $Vtx_2$ to the on-potential between the times $t_1$ and $t_2$ and between the times $t_5$ and $t_6$, the drive voltage $Vtx_3$ to the on-potential between the times $t_2$ and $t_3$ and between the times $t_6$ and $t_7$, and the drive voltage $Vtx_4$ to the on-potential between the times $t_3$ and $t_4$ and between the times $t_7$ and $t_8$ as illustrated in FIG. 20.

Incidentally, the drive voltage Vtxr applied to the transfer electrode 44 is set to the on-potential except for a period during which the other drive voltages $Vtx_1$ to $Vtx_4$ are initially set to the on-potential and then finally set to the off-potential. That is, in each of the frames F5, the drive voltage Vtxr is set to the off potential between the times $t_0$ and $t_8$, and is set to the on-potential in the other periods.

The second modification is an example in which the first frame F1 and the second frame F2 of the first modification are collectively executed in the single frame F5. Therefore, according to the second modification, it is possible to obtain a value of ½ of the total charge amount generated by the reflected light L2 similarly to the first modification, and further, it is possible to obtain a distance to the object B based on a difference among charge amounts stored in the storage nodes coupled, respectively, to the charge collection regions 15, 16, 57, and 58. That is, the output value of the first frame F1 of the first modification may be replaced by a value obtained by subtracting the charge amount of the charge collection region 15 from the charge amount of the charge collection region 16 in the second modification, and the output value of the second frame F2 of the first modification may be replaced by a value obtained by subtracting the charge amount of the charge collection region 57 from the charge amount of the charge collection region 58 in the second modification. Therefore, it is possible to apply the current injection circuit 20 of the above embodiment, and as a result, it is possible to avoid saturation of each storage node. Incidentally, in the second modification, one current injection circuit 20 is connected to the charge collection regions 15 and 16, and another current injection circuit 20 is connected to the charge collection regions 57 and 58.

The distance sensor according to the present invention is not limited to the above-described embodiments, and other various modifications can be made. For example, the case where each transistor is the MOSFET has been exemplified in the above embodiment, but each transistor may be another FET or a bipolar transistor.

REFERENCE SIGNS LIST

1A . . . distance sensor; 10 . . . semiconductor substrate; 10$a$ . . . surface; 10$b$ . . . back surface; 10$c$ . . . surface region; 11 . . . imaging region; 12 . . . sensor drive circuit; 13 . . . processing circuit; 14 . . . photosensitive region; 15 . . . first charge collection region; 16 . . . second charge collection region; 17 . . . first transfer electrode; 18 . . . second transfer electrode; 19 . . . photogate electrode; 20 . . . current injection circuit; 21 . . . voltage generation circuit; 22$a$ . . . first transistor; 22$b$ . . . second transistor; 23$a$ . . . third transistor; 23$b$ . . . fourth transistor; 24 . . . transistor pair; 25 . . . current source; 26$a$, 26$b$ . . . storage node; 27, 28 . . . buffer circuit; 30 . . . light source unit; 31 . . . light source; 32 . . . light source drive circuit; 33 . . . control circuit; 34 . . . power supply potential line; 35, 36 . . . reset circuit; 41 . . . insulating layer; 42, 43 . . . signal extraction electrode; 100 . . . current injection circuit; B . . . object; GND . . . reference potential line; L1 . . . irradiation light; L2 . . . reflected light; $N_1$ . . . node; P . . . pixel; Sr . . . reset signal; T . . . cycle; $t_L$ . . . on-time; $T_1$ . . . light irradiation timing; $T_2$ . . . delay time; $V_3, V_4, V_5, V_6$ . . . bias voltage (constant voltage); $VC_1, VC_2$ . . . control voltage; Vr . . . reset potential; and $Vtx_1, Vtx_2$ . . . drive voltage.

The invention claimed is:
1. A distance sensor configured to irradiate an object with light and measure a distance to the object by detecting reflected light from the object, the distance sensor comprising:
   a semiconductor substrate having a photosensitive region generating charges corresponding to a light amount of the reflected light, and first and second charge collection regions each collecting the charges from the photosensitive region, the first and second charge collection regions disposed in the state of being separated from the photosensitive region by a predetermined distance;
   a first transfer electrode disposed on a region between the photosensitive region and the first charge collection region, the first transfer electrode being set to an on-potential configured to enable charge transfer from the photosensitive region to the first charge collection region during a first period after irradiation of light, and set to an off-potential configured to stop the charge transfer during a second period following the first period;
   a second transfer electrode disposed on a region between the photosensitive region and the second charge collection region, the second transfer electrode being set to an off-potential configured to stop charge transfer from the photosensitive region to the second charge collection region during the first period, and set to an on-potential configured to enable the charge transfer during the second period;
   a voltage generation circuit having one end connected to a first constant potential line set to a predetermined potential and another end connected to a second constant potential line set to a lower potential than the first constant potential line, the voltage generation circuit being configured to generate a control voltage corresponding to a larger one between a charge amount stored in a storage node coupled to the first charge collection region and a charge amount stored in a storage node coupled to the second charge collection region;
   first and second transistors each having a control terminal to which the control voltage is applied, a first current terminal connected to the first constant potential line, and a second current terminal;
   a third transistor having a first current terminal connected to the second current terminal of the first transistor, a second current terminal connected to the storage node coupled to the first charge collection region, and a control terminal to be applied with a constant voltage; and a fourth transistor having a first current terminal connected to the second current terminal of the second transistor, a second current terminal connected to the storage node coupled to the second charge collection region, and a control terminal to be applied with a constant voltage.

2. The distance sensor according to claim 1, wherein the third and fourth transistors are MOSFETs.

\* \* \* \* \*